United States Patent
Song et al.

(10) Patent No.: US 12,464,877 B2
(45) Date of Patent: Nov. 4, 2025

(54) DISPLAY DEVICE, METHOD OF MANUFACTURING THE SAME, AND TILED DISPLAY DEVICE INCLUDING THE SAME

(71) Applicant: Samsung Display Co., LTD., Yongin-si (KR)

(72) Inventors: Seung Min Song, Yongin-si (KR); Sae Hee Ryu, Yongin-si (KR); Il You, Yongin-si (KR); Seung Min Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 444 days.

(21) Appl. No.: 18/112,804

(22) Filed: Feb. 22, 2023

(65) Prior Publication Data

US 2023/0411576 A1    Dec. 21, 2023

(30) Foreign Application Priority Data

May 30, 2022  (KR) .................. 10-2022-0065996

(51) Int. Cl.
    *H10H 20/857*    (2025.01)
    *G09F 9/302*     (2006.01)
    (Continued)

(52) U.S. Cl.
    CPC ......... *H10H 20/857* (2025.01); *G09F 9/3026* (2013.01); *G09G 3/006* (2013.01);
    (Continued)

(58) Field of Classification Search
    CPC .. H10H 20/857; H10H 20/01; H10H 20/0364; G09F 9/3026; G09G 3/006; G09G 2330/12; G09G 2300/026; H01L 25/0753
    See application file for complete search history.

(56) References Cited

U.S. PATENT DOCUMENTS

2014/0374703 A1* 12/2014 Jung ............... H10K 71/70
                                          257/40
2015/0144915 A1*  5/2015 Lee ................ G02F 1/136204
                                          257/40

(Continued)

FOREIGN PATENT DOCUMENTS

CN    110957329    4/2020
KR    10-0555169   5/2006

OTHER PUBLICATIONS

Extended European Search Report for European Application No. 23166171.1, dated Nov. 8, 2023.

*Primary Examiner* — Hang Lin
(74) *Attorney, Agent, or Firm* — Womble Bond Dickinson (US) LLP

(57) ABSTRACT

A display device includes a first substrate including a first contact hole, a first barrier insulating layer disposed on the first substrate and including second contact holes, pad parts inserted into some contact holes of the second contact holes, inspection pad parts inserted into other contact holes of the second contact holes, fan-out lines formed of a first metal layer on the first barrier insulating layer and being integral with the pad parts, a display layer disposed on the fan-out lines, and a flexible film disposed below the first substrate and inserted into the first contact hole to be electrically connected to the pad parts. A width of each of the pad parts is greater than a width of each of the second contact holes, and a width of each of the inspection pad parts is smaller than the width of each of the second contact holes.

20 Claims, 20 Drawing Sheets

(51) Int. Cl.
*G09G 3/00* (2006.01)
*H01L 25/075* (2006.01)
*H10H 20/01* (2025.01)

(52) U.S. Cl.
CPC ......... *H01L 25/0753* (2013.01); *H10H 20/01* (2025.01); *G09G 2330/12* (2013.01); *H10H 20/0364* (2025.01)

(56) References Cited

U.S. PATENT DOCUMENTS

| | | |
|---|---|---|
| 2016/0209460 A1* | 7/2016 | Lee .................. H10K 71/70 |
| 2022/0077195 A1 | 3/2022 | Jeong et al. |
| 2022/0123188 A1 | 4/2022 | Chen et al. |

* cited by examiner

DPL: TFTL, EML, WLCL, CFL
TFT: SE, GE, ACT, DE
PAD: DPD, VPD1
MTL2: VL1, VL2
ACTL: ACT, DE, SE
MTL3: GE
MTL4: CNE1, CNE2

DISPLAY DEVICE, METHOD OF MANUFACTURING THE SAME, AND TILED DISPLAY DEVICE INCLUDING THE SAME

CROSS-REFERENCE TO RELATED APPLICATION(S)

This application claims priority to and benefits of Korean Patent Application No. 10-2022-0065996 under 35 U.S.C. § 119, filed on May 30, 2022, in the Korean Intellectual Property Office (KIPO), the entire contents of which are herein incorporated herein by reference.

BACKGROUND

1. Technical Field

Embodiments relate to a display device, a method of manufacturing the display device, and a tiled display device including the display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes light emitting elements that emit light by themselves.

In case that the display device is manufactured in a great size, a defective rate of the light emitting elements may increase due to an increase in the number of pixels, and productivity or reliability of the display device may decrease. In order to solve such a problem, a tiled display device may realize a screen having a great size by connecting display devices having a relatively small size to each other. The tiled display device may include boundary portions called seams between the display devices due to non-display areas or bezel areas of each of the display devices adjacent to each other. In case that one image is displayed on the entire screen, the boundary portions between the display devices give a sense of discontinuity to the entire screen to decrease a degree of immersion of the image.

SUMMARY

Embodiments provide a display device capable of reducing an inspection time, reducing a bonding material such as a flexible film, and increasing a yield and a productivity by quickly deciding defective products that are not detected with the naked eye, a method of manufacturing the display device, and a tiled display device including the display device.

Embodiments also provide a display device capable of preventing or minimizing a sense of discontinuity between a plurality of display devices and improving a degree of immersion of an image by preventing boundary portions between or non-display areas of the plurality of display devices from being recognized, a method of manufacturing the display device, and a tiled display device including the display device.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include a first substrate including a first contact hole, a first barrier insulating layer disposed on the first substrate and including a plurality of second contact holes, pad parts inserted into some contact holes of the plurality of second contact holes, inspection pad parts inserted into other contact holes of the plurality of second contact holes, fan-out lines formed of a first metal layer on the first barrier insulating layer and being integral with the pad parts, a display layer disposed on the fan-out lines, and a flexible film disposed below the first substrate and inserted into the first contact hole to be electrically connected to the pad parts. A width of each of the pad parts may be greater than a width of each of the plurality of second contact holes, and a width of each of the inspection pad parts may be smaller than the width of each of the plurality of second contact holes.

The display device may further include a second barrier insulating layer disposed on the first barrier insulating layer, the pad parts, and the inspection pad parts. The second barrier insulating layer may cover an area between the inspection pad parts and the first barrier insulating layer spaced apart from each other.

The pad parts may include a plurality of data pad parts that supply data voltages to the display layer, and a plurality of first power pad parts that supply high potential voltages to the display layer.

The inspection pad parts may be disposed between the plurality of data pad parts.

The display device may further include an inspection line electrically connecting the plurality of first power pad parts to the inspection pad parts.

The inspection line may overlap the first contact hole.

The display layer may include connection parts formed of a second metal layer on the first metal layer and connected to the fan-out lines, a plurality of data lines formed of the second metal layer and extending in a first direction, and a plurality of high potential lines formed of the second metal layer and extending in the first direction.

The plurality of data pad parts may be configured to supply the data voltages to the plurality of data lines through the connection parts, and the plurality of first power pad parts may be configured to supply the high potential voltages to the plurality of high potential lines through the connection parts.

The pad parts may include a plurality of data pad parts that supply data voltages to the display layer, a first power pad part that supplies a high potential voltage to the display layer, and a second power pad part that supplies a low potential voltage to the display layer.

The display device may further include a plurality of inspection lines electrically connecting the first power pad part to the inspection pad parts and electrically connecting the second power pad part to the inspection pad parts.

The display device may further include a display area including a plurality of pixels, and a non-display area disposed around the display area. Each of the plurality of inspection lines may extend from the first contact hole overlapping the display area to the non-display area.

The display layer may include connection parts formed of a second metal layer on the first metal layer and connected to the fan-out lines, high potential lines formed of the second metal layer and extending in a first direction, and vertical voltage lines formed of the second metal layer and extending in the first direction.

The first power pad part may be configured to supply the high potential voltage to the high potential lines through the connection parts, and the second power pad part may be configured to supply the low potential voltage to the vertical voltage lines through the connection parts.

According to an embodiment, a method of manufacturing a display device may include providing a first substrate, providing a first barrier insulating layer disposed on the first substrate and including a plurality of second contact holes, forming inspection pad parts and pad parts, the inspection pad parts being inserted into some contact holes of the plurality of second contact holes, and the pad parts being disposed on the first insulating layer and inserted into other contact holes of the plurality of second contact holes, forming a display layer on the inspection pad parts and the pad parts, forming a first contact hole passing through the first substrate from a lower portion of the first substrate, inspecting states of the inspection pad parts and the pad parts, and forming a flexible film disposed below the first substrate and inserted into the first contact hole to be electrically connected to the pad parts. A width of each of the inspection pad parts may be smaller than a width of each of the second contact holes, and a width of each of the pad parts may be greater than the width of each of the second contact holes.

The pad parts may include a plurality of data pad parts that supply data voltages to the display layer, and a plurality of first power pad parts that supply high potential voltages to the display layer.

The inspecting of the states of the inspection pad parts and the pad parts may include deciding whether or not the inspection pad parts connected between the plurality of first power pad parts has a reference resistance value.

The pad parts may include a plurality of data pad parts that supply data voltages to the display layer, a first power pad part that supplies a high potential voltage to the display layer, and a second power pad part that supplies a low potential voltage to the display layer.

The inspecting of the states of the inspection pad parts and the pad parts may include deciding whether or not the inspection pad parts connected between the first and second power pad parts has a reference resistance value.

The forming of the inspection pad parts and the pad parts may include forming an inspection line electrically connecting each of the first and second power pad parts to the inspection pad parts. The inspecting of the states of the inspection pad parts and the pad parts may further include removing a portion of the inspection line in case that it is decided that the inspection pad parts and the pad parts are in normal states.

According to an embodiment, a tiled display device may include a plurality of display devices each including a display area including a plurality of pixels and a non-display area surrounding the display area, and a coupling member coupling the plurality of display devices to each other. Each of the plurality of display devices may include a first substrate including a first contact hole, a first barrier insulating layer disposed on the first substrate and including a plurality of second contact holes, pad parts inserted into some contact holes of the plurality of second contact holes, inspection pad parts inserted into other contact holes of the plurality of second contact holes, fan-out lines formed of a first metal layer on the first barrier insulating layer and being integral with the pad parts, a display layer disposed on the fan-out lines, and a flexible film disposed below the first substrate and inserted into the first contact hole to be electrically connected to the pad parts. A width of each of the pad parts may be greater than a width of each of the plurality of second contact holes, and a width of each of the inspection pad parts may be smaller than the width of each of the plurality of second contact holes.

In accordance with the display device, the method of manufacturing the display device, and the tiled display device including the display device according to embodiments, the display device may include inspection pad parts having a width smaller than that of a contact hole, and thus, it may be decided that the inspection pad parts and pad parts have been damaged before a flexible film is attached, such that an inspection time may be reduced, a bonding material such as the flexible film may be reduced, and a yield and a productivity may be increased.

In accordance with the display device, the method of manufacturing the display device, and the tiled display device including the display device according to embodiments, an area of a non-display area of the display device may be minimized by electrically connecting a display driver disposed below the substrate and a connection part disposed on the substrate to each other. Accordingly, in the display device, the method of manufacturing the display device, and the tiled display device including the display device, it is possible to prevent a user from recognizing non-display areas of or boundary portions between a plurality of display devices by minimizing an interval between the plurality of display devices.

The effects of the disclosure are not limited to the aforementioned effects, and various other effects are included in the descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
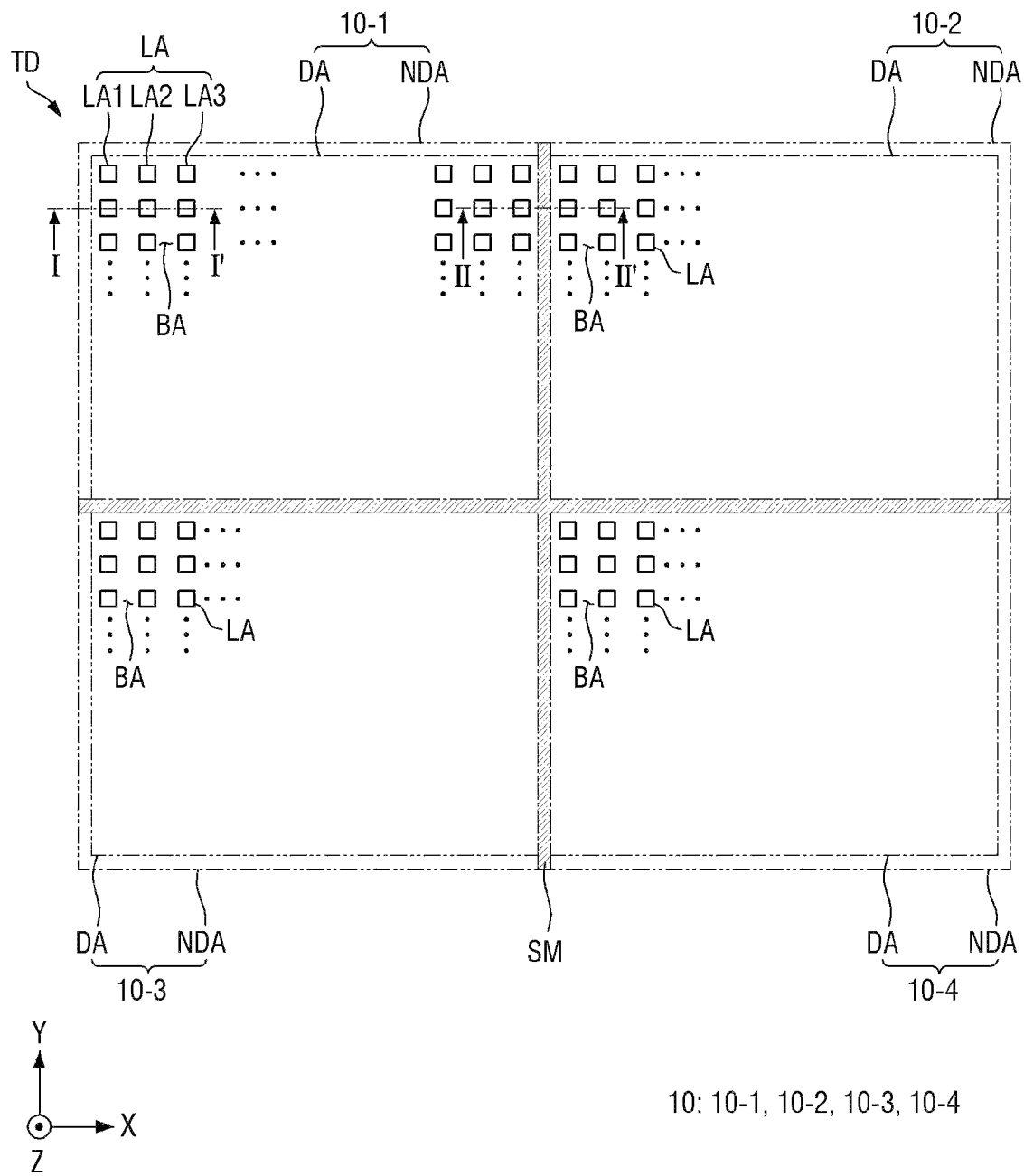
FIG. 1 is a schematic plan view illustrating a tiled display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, parts, and/or modules without departing from the scope of the invention. Further, the blocks, units, and/or modules of some embodiments may be physically combined into more complex blocks, units, and/or modules without departing from the scope of the invention.

Hereinafter, detailed embodiments is described with reference to the accompanying drawings.

FIG. 1 is a schematic plan view illustrating a tiled display device according to an embodiment.

Referring to FIG. 1, a tiled display device TD may include display devices 10. The display devices 10 may be arranged in a lattice shape, but embodiments are not limited thereto. The display devices 10 may be connected to each other in a first direction (e.g., X-axis direction) or a second direction (e.g., Y-axis direction), and the tiled display device TD may have a specific shape. As an example, the display devices 10 may have the same size, but embodiments are not limited thereto. As another example, the display devices 10 may have different sizes.

The tiled display device TD may include first, second, third, and fourth display devices 10-1, 10-2, 10-3, and 10-4. The number of display devices 10 and a coupling relationship between the display devices 10 are not limited to those of an embodiment of FIG. 1. The number of display devices 10 may be determined according to sizes of each of the display devices 10 and the tiled display device TD.

Each of the display devices 10 may have a rectangular shape including long sides and short sides. The display devices 10 may be disposed with long sides or short sides connected to each other. Some display devices 10 may be disposed at edges of the tiled display device TD, and may form one side of the tiled display device TD. Some other display devices 10 may be disposed at corners of the tiled display device TD, and may form two adjacent sides of the tiled display device TD. Some other display devices 10 may be disposed inside the tiled display device TD, and be surrounded by the other display devices 10.

Each of the display devices 10 may include a display area DA and a non-display area NDA. The display area DA may include pixels that display an image. Each of the pixels may include an organic light emitting diode including an organic light emitting layer, a quantum dot light emitting diode including a quantum dot light emitting layer, a micro light emitting diode, or an inorganic semiconductor light emitting diode including an inorganic semiconductor. Hereinafter, it will be described that each of the pixels includes an inorganic light emitting diode, but embodiments are not limited thereto. The non-display area NDA may be disposed around the display area DA to surround the display area DA, and may not display an image.

The display device 10 may include pixels arranged along rows and columns in the display area DA. Each of the pixels may include an emission area LA defined by a pixel defining film or a bank, and may emit light having a certain peak wavelength through the emission area LA. For example, the display area DA of the display device 10 may include first, second, and third emission areas LA1, LA2, and LA3. Each of the first to third emission areas LA1, LA2, and LA3 may be an area in which light generated by a light emitting element of the display device 10 is emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but embodiments are not limited thereto.

The first to third emission areas LA1, LA2, and LA3 may be sequentially and repeatedly disposed along the first direction (e.g., X-axis direction) of the display area DA. As an example, an area of the third emission area LA3 may be greater than that of the first emission area LA1, and an area of the first emission area LA1 may be greater than that of the second emission area LA2, but embodiments are not limited thereto. As another example, an area of the first emission area LA1, an area of the second emission area LA2, and an area of the third emission area LA3 may be substantially the same as each other.

The display area DA of the display device 10 may include light blocking areas BA surrounding emission areas LA. The light blocking areas BA may prevent color mixing of light emitted from the first to third emission areas LA1, LA2, and LA3.

The tiled display device TD may have an overall planar shape, but embodiments are not limited thereto. The tiled display device TD may have a three-dimensional shape to provide a three-dimensional effect to a user. As an example, in case that the tiled display device TD has the three-dimensional shape, at least some of the display devices 10 may have a curved shape. As another example, the display devices 10 have a planar shape and are connected to each other at an angle, such that the tiled display device TD may have a three-dimensional shape.

The tiled display device TD may include coupling areas SM disposed between display areas DA. The tiled display device TD may be formed by connecting the non-display areas NDA of adjacent display devices 10 to each other. The display devices 10 may be connected to each other through coupling members or adhesive members disposed in the coupling areas SM. The coupling area SM may not include pad parts or flexible films attached to the pad parts. Accordingly, a distance between the display areas DA of each of the display devices 10 may be too small for the coupling areas SM to be recognized by the user. For example, external light reflectivity of the display areas DA of each of the display devices 10 may be substantially the same as external light reflectivity of the coupling areas SM. Accordingly, the tiled display device TD may remove a sense of discontinuity between the display devices 10 and improve a degree of immersion of an image by preventing the coupling areas SM between the display devices 10 from being recognized by the user.

Figure 2:
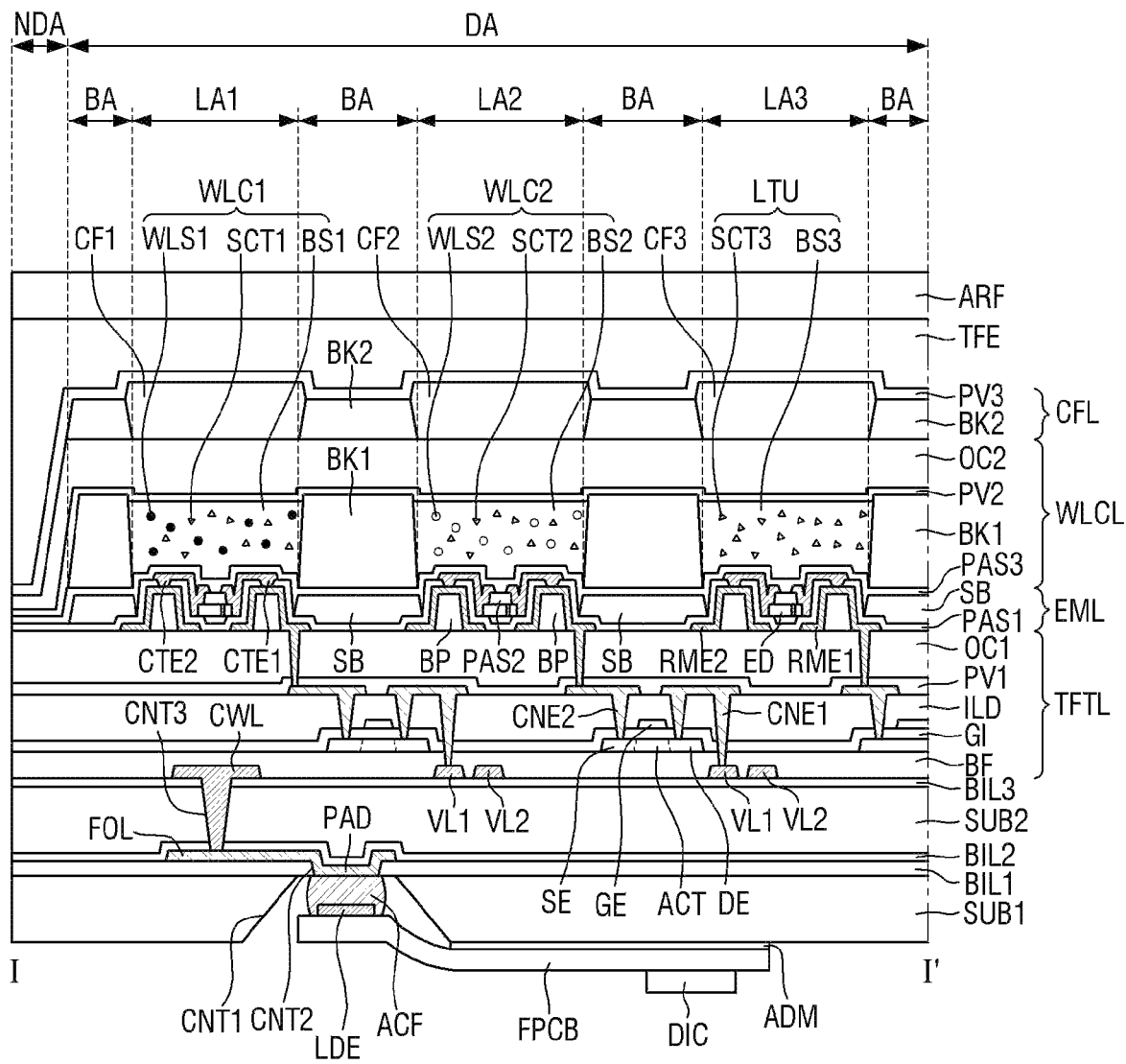
FIG. 2 is a schematic cross-sectional view taken along line I-I' of FIG. 1.

FIG. 2 is a schematic cross-sectional view taken along line I-I' of FIG. 1.

Referring to FIG. 2, the display area DA of the display device 10 may include first to third emission areas LA1, LA2, and LA3. Each of the first to third emission areas LA1, LA2, and LA3 may be an area in which light generated by light emitting elements ED of the display device 10 is emitted to the outside of the display device 10.

The display device 10 may include a first substrate SUB1, a first barrier insulating layer BIL1, a first metal layer MTL1, a second barrier insulating layer BIL2, a second substrate SUB2, a third barrier insulating layer BIL3, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate that may be bendable, foldable, or rollable. As an example, the first substrate SUB1 may include an insulating material such as a polymer resin, for example, polyimide (PI), but embodiments are not limited thereto. As another example, the first substrate SUB1 may be a rigid substrate including a glass material.

The first substrate SUB1 may include a first contact hole CNT1. The first contact hole CNT1 may be etched from a lower surface of the first substrate SUB1 to penetrate up to an upper surface of the first substrate SUB1. For example, a width of a lower portion of the first contact hole CNT1 may be greater than a width of an upper portion of the first contact hole CNT1. In a process of manufacturing the display device 10, a pad part PAD inserted into a second contact hole CNT2 may be exposed by the first contact hole CNT1, and the pad part PAD may be connected (e.g., electrically connected) to a lead electrode LDE of the flexible film FPCB through a connection film ACF inserted into the first contact hole CNT1.

The first barrier insulating layer BIL1 may be disposed on the first substrate SUB1. The first barrier insulating layer BIL1 may include an inorganic film capable of preventing penetration of air or moisture. For example, the first barrier insulating layer BIL1 may include at least one of a silicon nitride layer, a silicon oxynitride layer, a silicon oxide layer, a titanium oxide layer, an aluminum oxide layer, and an amorphous silicon layer, but embodiments are not limited thereto.

The first barrier insulating layer BIL1 may include the second contact hole CNT2. The second contact hole CNT2 may be etched from an upper surface of the first barrier insulating layer BIL1 to penetrate up to a lower surface of the first barrier insulating layer BIL1. For example, a width of an upper portion of the second contact hole CNT2 may be greater than a width of a lower portion of the second contact hole CNT2.

The first metal layer MTL1 may be disposed on the first barrier insulating layer BIL1. The first metal layer MTL1 may include a fan-out line FOL. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The pad part PAD may be integral with the fan-out line FOL and inserted into the second contact hole CNT2. The pad part PAD may connect (e.g., electrically connect) the flexible film FPCB and a connection part CWL to each other. The pad part PAD may be exposed by the first contact hole CNT1 of the first substrate SUB1. The pad part PAD may be connected (e.g., electrically connected) to the lead electrode LDE of the flexible film FPCB through the connection film ACF. The fan-out line FOL may be connected (e.g., electrically connected) to a data line, a power line, or a gate line through the connection part CWL. The data line or the power line may be connected to a drain electrode DE of a thin film transistor TFT. The gate line may be connected to a gate electrode GE of the thin film transistor TFT. Accordingly, the fan-out line FOL may supply a data voltage, a source voltage, or a gate signal received from the display driver DIC of the flexible film FPCB to the thin film transistor TFT of the pixel through the connection part CWL. The display device 10 may include the fan-out line FOL disposed in the display area DA, and thus, an area of the non-display area NDA may be minimized.

The second barrier insulating layer BIL2 may be disposed on the first barrier insulating layer BIL1 and the first metal layer MTL1. The second barrier insulating layer BIL2 may include an inorganic film capable of preventing penetration of air or moisture. For example, the second barrier insulating layer BIL2 may include at least one of a silicon nitride layer, a silicon oxynitride layer, a silicon oxide layer, a titanium oxide layer, an aluminum oxide layer, and an amorphous silicon layer, but embodiments are not limited thereto.

The second substrate SUB2 may be disposed on the second barrier insulating layer BIL2. The second substrate SUB2 may be a base substrate or a base member. The second substrate SUB2 may be a flexible substrate that may be bent, folded, or rolled. As an example, the second substrate SUB2 may include an insulating material such as a polymer resin, for example, polyimide (PI), but embodiments are not limited thereto.

The third barrier insulating layer BIL3 may be disposed on the second substrate SUB2. The third barrier insulating layer BIL3 may include an inorganic film capable of preventing penetration of air or moisture. For example, the third barrier insulating layer BIL3 may include at least one of a silicon nitride layer, a silicon oxynitride layer, a silicon oxide layer, a titanium oxide layer, an aluminum oxide layer, and an amorphous silicon layer, but embodiments are not limited thereto.

The third barrier insulating layer BIL3, the second substrate SUB2, and the second barrier insulating layer BIL2 may include a third contact hole CNT3. The third contact hole CNT3 may be etched from an upper surface of the third barrier insulating layer BIL3 to penetrate up to a lower surface of the second barrier insulating layer BIL2. For example, a width of an upper portion of the third contact hole CNT3 may be greater than a width of a lower portion of the third contact hole CNT3. In the process of manufacturing the display device 10, an upper surface of the fan-out line FOL may be exposed by the third contact hole CNT3, and the fan-out line FOL may be in contact with the connection part CWL inserted into the third contact hole CNT3.

The display layer DPL may be disposed on the third barrier insulating layer BIL3. The display layer DPL may include a thin film transistor layer TFTL a light emitting element layer EML, a wavelength conversion layer WLCL, and a color filter layer CFL. The thin film transistor layer TFTL may include a second metal layer MTL2, a buffer layer BF, an active layer ACTL, a gate insulating layer GI, a third metal layer MTL3, an interlayer insulating layer ILD, a fourth metal layer MTL4, a first passivation layer PV1, and a first planarization layer OC1.

The second metal layer MTL2 may be disposed on the third barrier insulating layer BIL3. The second metal layer MTL2 may include the connection part CWL and first and second voltage lines VL1 and VL2. The connection part CWL and the first and second voltage lines VL1 and VL2 may be formed of the same material and/or on the same layer, but embodiments are not limited thereto. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The connection part CWL may be inserted into the third contact hole CNT3 to be connected to the fan-out line FOL. For example, the connection part CWL may be connected (e.g., electrically connected) to the data line to supply the data voltage to the thin film transistor TFT. The connection part CWL may be connected (e.g., electrically connected) to the power line to supply the source voltage to the thin film transistor TFT. The connection part CWL may be connected (e.g., electrically connected) to the gate line to supply the gate signal to the gate electrode GE of the thin film transistor TFT. Accordingly, the connection part CWL may supply the data voltage, the source voltage, or the gate signal received from the display driver DIC through the fan-out line FOL to the thin film transistor TFT of the pixel.

The first and second voltage lines VL1 and VL2 may extend in the second direction (e.g., Y-axis direction) in the display area DA. Each of the first and second voltage lines VL1 and VL2 may be connected (e.g., electrically connected) to the fan-out line FOL. Each of the first and second voltage lines VL1 and VL2 may be connected (e.g., electrically connected) to the thin film transistor TFT or the light emitting element ED. For example, each of the first and second voltage lines VL1 and VL2 may be a data line, a high potential line, a low potential line, or a sensing line, but embodiments are not limited thereto.

The buffer layer BF may be disposed on the second metal layer MTL2 and the third barrier insulating layer BIL3. The buffer layer BF may include an inorganic material capable of preventing permeation of air or moisture. For example, the buffer layer BF may include inorganic films that are alternately stacked.

The active layer ACTL may be disposed on the buffer layer BF. The active layer ACTL may include a semiconductor region ACT, the drain electrode DE, and a source electrode SE of the thin film transistor TFT. The semiconductor region ACT may overlap the gate electrode GE in a thickness direction (e.g., Z-axis direction), and may be insulated from the gate electrode GE by the gate insulating layer GI. The drain electrode DE and the source electrode SE may be provided by making a material of the semiconductor region ACT conductors (by doping dopants). The thin film transistor TFT may constitute a pixel circuit of each of the pixels. For example, the thin film transistor TFT may be a driving transistor or a switching transistor of the pixel circuit.

The gate insulating layer GI may be disposed on the active layer ACTL and the buffer layer BF. The gate insulating layer GI may insulate the semiconductor region ACT and the gate electrode GE of the thin film transistor TFT from each other. The gate insulating layer GI may include contact holes through which first and second connection electrodes CNE1 and CNE2 penetrate, respectively.

The third metal layer MTL3 may be disposed on the gate insulating layer GI. The third metal layer MTL3 may include the gate electrode GE of the thin film transistor TFT. The gate electrode GE may overlap the semiconductor region ACT with the gate insulating layer GI disposed therebetween. The gate electrode GE may receive the gate signal from the gate line. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer insulating layer ILD may be disposed on the third metal layer MTL3. The interlayer insulating layer ILD may insulate the third and fourth metal layers MTL3 and MTL4 from each other. The interlayer insulating layer ILD may include contact holes through which the first and second connection electrodes CNE1 and CNE2 penetrate, respectively.

The fourth metal layer MTL4 may be disposed on the interlayer insulating layer ILD. The fourth metal layer MTL4 may include the first and second connection electrodes CNE1 and CNE2. The first and second connection electrodes CNE1 and CNE2 may be formed of the same material and/or on the same layer, but embodiments are not limited thereto. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The first connection electrode CNE1 may connect (e.g., electrically connect) the first voltage line VL1 and the drain electrode DE of the thin film transistor TFT to each other. An end portion of the first connection electrode CNE1 may be in contact with the first voltage line VL1 of the second metal layer MTL2, and another end portion of the first connection electrode CNE1 may be in contact with the drain electrode DE of the active layer ACTL.

The second connection electrode CNE2 may connect (e.g., electrically connect) the source electrode SE of the thin film transistor TFT and a first electrode RME1 to each other. An end portion of the second connection electrode CNE2 may be in contact with the source electrode SE of the active layer ACTL, and the first electrode RME1 of the light emitting element layer EML may be in contact with another end portion of the second connection electrode CNE2.

The first passivation layer PV1 may be disposed on the fourth metal layer MTL4 and the interlayer insulating layer ILD. The first passivation layer PV1 may protect the thin film transistor TFT. The first passivation layer PV1 may include a contact hole through which the first electrode RME1 penetrates.

The first planarization layer OC1 may be provided on the first passivation layer PV1 to planarize an upper end portion of the thin film transistor layer TFTL. For example, the first planarization layer OC1 may include a contact hole through which the first electrode RME1 penetrates. For example, the contact hole of the first planarization layer OC1 may be connected to the contact hole of the first passivation layer PV1. The first planarization layer OC1 may include an organic insulating material such as polyimide (PI).

The light emitting element layer EML may be disposed on the thin film transistor layer TFTL. The light emitting element layer EML may include protrusion patterns BP, the first electrode RME1, a second electrode RME2, a first insulating layer PAS1, a sub-bank SB, light emitting elements ED, a second insulating layer PAS2, a first contact electrode CTE1, a second contact electrode CTE2, and a third insulating layer PAS3.

The protrusion patterns BP may be disposed on the first planarization layer OC1. The protrusion patterns BP may protrude from an upper surface of the first planarization layer OC1. Protrusion patterns BP may be disposed in emission areas LA or opening areas of each of the pixels. Light emitting elements ED may be disposed between the protrusion patterns BP. The protrusion patterns BP may have inclined side surfaces, and light emitted from the light emitting elements ED may be reflected by the first and second electrodes RME1 and RME2 disposed on the protrusion patterns BP. For example, the protrusion pattern BP may include an organic insulating material such as polyimide (PI).

The first electrode RME1 may be disposed on the first planarization layer OC1 and the protrusion pattern BP. The first electrode RME1 may be disposed on the protrusion pattern BP disposed on a side of the light emitting elements ED. The first electrode RME1 may be disposed on the inclined side surfaces of the protrusion pattern BP to reflect the light emitted from the light emitting elements ED. The first electrode RME1 may be inserted into the contact holes provided in the first planarization layer OC1 and the first passivation layer PV1 to be connected to the second connection electrode CNE2. The first electrode RME1 may be connected (e.g., electrically connected) to end portions of the light emitting elements ED through the first contact electrode CTE1. For example, the first electrode RME1 may receive a voltage proportional to luminance of the light emitting element ED from the thin film transistor TFT of the pixel.

The second electrode RME2 may be disposed on the first planarization layer OC1 and the protrusion pattern BP. The second electrode RME2 may be disposed on the protrusion pattern BP disposed on another side of the light emitting elements ED. The second electrode RME2 may be disposed on the inclined side surfaces of the protrusion pattern BP to reflect the light emitted from the light emitting elements ED. The second electrode RME2 may be connected (e.g., electrically connected) to the other end portions of the light emitting elements ED through the second contact electrode CTE2. For example, the second electrode RME2 may receive a low potential voltage supplied to all pixels from the low potential line.

The first and second electrodes RME1 and RME2 may include a conductive material having high reflectivity. As an example, the first and second electrodes RME1 and RME2 may include at least one of aluminum (Al), silver (Ag), copper (Cu), nickel (Ni), and lanthanum (La). As another example, the first and second electrodes RME1 and RME2 may include a material such as indium tin oxide (ITO), indium zinc oxide (IZO), or indium tin zinc oxide (ITZO). As still another example, the first and second electrodes RME1 and RME2 may include layers having a transparent conductive material layer and a metal layer having high reflectivity or include a single layer including a transparent conductive material and a metal having high reflectivity. The first and second electrodes RME1 and RME2 may have a stacked structure such as ITO/Ag/ITO/, ITO/Ag/IZO, or ITO/Ag/ITZO/IZO.

The first insulating layer PAS1 may be disposed on the first planarization layer OC1 and the first and second electrodes RME1 and RME2. The first insulating layer PAS1 may insulate the first and second electrodes RME1 and RME2 from each other with protecting the first and second electrodes RME1 and RME2. The first insulating layer PAS1 may prevent the light emitting elements ED from being in direct contact with and damaged by the first and second electrodes RME1 and RME2 in a process of aligning the light emitting elements ED.

The sub-bank SB may be disposed in the light blocking areas BA on the first insulating layer PAS1. The sub-bank SB may be disposed at boundary portions between the pixels to divide the light emitting elements ED of each of the pixels. The sub-bank SB may have a height and may include an organic insulating material such as polyimide (PI).

The light emitting elements ED may be disposed on the first insulating layer PAS1. The light emitting elements ED may be aligned in parallel with each other between the first and second electrodes RME1 and RME2. A length of the light emitting element ED may be greater than a distance between the first and second electrodes RME1 and RME2. The light emitting element ED may include semiconductor layers, and may have an end portion defined on the basis of a first semiconductor layer and another end portion opposite to the end portion and defined on the basis of a second semiconductor layer. An end portion of the light emitting element ED may be disposed on the first electrode RME1, and another end portion of the light emitting element ED may be disposed on the second electrode RME2. An end portion of the light emitting element ED may be connected (e.g., electrically connected) to the first electrode RME1 through the first contact electrode CTE1, and another end portion of the light emitting element ED may be connected (e.g., electrically connected) to the second electrode RME2 through the second contact electrode CTE2.

The light emitting elements ED may have a size of a micro-meter or a nano-meter unit, and may be inorganic light emitting diodes including an inorganic material. The light emitting elements ED may be aligned between the first and second electrodes RME1 and RME2 according to an electric field formed in a specific direction between the first and second electrodes RME1 and RME2 facing each other.

For example, the light emitting elements ED may include active layers having the same material to emit light of the same wavelength band or light of the same color. Light emitted from each of the first to third emission areas LA1, LA2, and LA3 of the light emitting element layer EML may have the same color. For example, the light emitting elements ED may emit light of a third color or blue light having a peak wavelength in the range of about 440 nm to about 480 nm, but embodiments are not limited thereto.

The second insulating layer PAS2 may be disposed on the light emitting elements ED. For example, the second insulating layer PAS2 may partially surround the light emitting elements ED, and may not cover end portions (e.g., opposite end portions) of each of the light emitting elements ED. The second insulating layer PAS2 may protect the light emitting elements ED and may fix the light emitting elements ED in the process of manufacturing the display device 10. The second insulating layer PAS2 may fill spaces between the light emitting elements ED and the first insulating layer PAS1.

The first contact electrode CTE1 may be disposed on the first insulating layer PAS1, and may be inserted into a contact hole provided in the first insulating layer PAS1 to be connected to the first electrode RME1. For example, the contact hole of the first insulating layer PAS1 may be provided on the protrusion pattern BP, but embodiments are not limited thereto. An end portion of the first contact electrode CTE1 may be connected to the first electrode RME1 on the protrusion pattern BP, and the other end portions of the first contact electrode CTE1 may be connected to end portions of the light emitting elements ED.

The second contact electrode CTE2 may be disposed on the first insulating layer PAS1, and may be inserted into a contact hole provided in the first insulating layer PAS1 to be connected to the second electrode RME2. For example, the contact hole of the first insulating layer PAS1 may be provided on the protrusion pattern BP, but embodiments are not limited thereto. An end portion of the second contact electrode CTE2 may be connected to another end portion of the light emitting element ED, and another end portion of the second contact electrode CTE2 may be connected to the second electrode RME2 on the protrusion pattern BP.

The third insulating layer PAS3 may be disposed on the first and second contact electrodes CTE1 and CTE2, the sub-bank SB, and the first and second insulating layers PAS1 and PAS2. The third insulating layer PAS3 may be disposed at an upper end portion of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion part WLC1, a second wavelength conversion part WLC2, a light transmission part LTU, a second passivation layer PV2, and a second planarization layer OC2.

The first light blocking member BK1 may be disposed in the light blocking areas BA on the third insulating layer PAS3. The first light blocking member BK1 may overlap the sub-bank SB in the thickness direction (e.g., Z-axis direction). The first light blocking member BK1 may block transmission of light. The first light blocking member BK1 may improve a color reproduction rate of the display device 10 by preventing colors from being mixed with each other due to permeation of the light between the first to third emission areas LA1, LA2, and LA3. The first light blocking member BK1 may be disposed in the form of a lattice surrounding the first to third emission areas LA1, LA2, and LA3 in plan view.

The first wavelength conversion part WLC1 may be disposed in the first emission area LA1 on the third insulating layer PAS3. The first wavelength conversion part WLC1 may be surrounded by the first light blocking member BK1. The first wavelength conversion part WLC1 may convert or shift a peak wavelength of incident light to a first peak wavelength. The first wavelength conversion part WLC1 may include a first base resin BS1, first scatterers SCT1, and first wavelength shifters WLS1.

The first base resin BS1 may include a material having a relatively high light transmissivity. The first base resin BS1 may be made of a transparent organic material. For example, the first base resin BS1 may include at least one of organic materials such as an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$) or include an organic particle such as an acrylic resin or a urethane-based resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to the first peak wavelength. For example, the first wavelength shifter WLS1 may convert blue light provided from the display device 10 into red light having a single peak wavelength in the range of about 610 nm to about 650 nm and emit the red light. The first wavelength shifter WLS1 may be a quantum dot, a quantum rod, or a phosphor. The quantum dot may be a particulate matter emitting a specific color in case that electrons are transitioned from a conduction band to a valence band.

A portion of the blue light provided from the light emitting element layer EML may be transmitted through the first wavelength conversion part WLC1 without being converted into red light by the first wavelength shifter WLS1. Light incident on a first color filter CF1 without being converted by the first wavelength conversion part WLC1 in the blue light provided from the light emitting element layer EML may be blocked by the first color filter CF1. The red light converted by the first wavelength conversion part WLC1 in the blue light provided from the light emitting element layer EML may be transmitted through the first color filter CF1 and then emitted to the outside. Accordingly, the first emission area LA1 may emit the red light.

The second wavelength conversion part WLC2 may be disposed in the second emission area LA2 on the third insulating layer PAS3. The second wavelength conversion part WLC2 may be surrounded by the first light blocking member BK1. The second wavelength conversion part WLC2 may convert or shift a peak wavelength of incident light to a second peak wavelength. The second wavelength conversion part WLC2 may include a second base resin BS2, second scatterers SCT2, and second wavelength shifters WLS2.

The second base resin BS2 may include a material having a relatively high light transmissivity. The second base resin BS2 may be made of a transparent organic material. For example, the second base resin BS2 and the first base resin BS1 may be made of the same material. For example, the second base resin BS2 may be made of the material of the first base resin BS1.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light. For example, the second scatterer SCT2 and the first scatterer SCT1 may be made of the same material. For example, the second scatterer SCT2 may be made of the material of the first scatterer SCT1.

The second wavelength shifter WLS2 may convert or shift the peak wavelength of the incident light to the second peak wavelength different from the first peak wavelength of the first wavelength shifter WLS1. For example, the second wavelength shifter WLS2 may convert the blue light provided from the display device 10 into green light having a single peak wavelength in the range of about 510 nm to about 550 nm and emit the green light. The second wavelength shifter WLS2 may be a quantum dot, a quantum rod, or a phosphor. The second wavelength shifter WLS2 may include the material of the first wavelength shifter WLS1. The second wavelength shifter WLS2 may be formed as a quantum dot, a quantum rod, or a phosphor so that a wavelength conversion range of the second wavelength shifter WLS2 may be different from a wavelength conversion range of the first wavelength shifter WLS1.

The light transmission part LTU may be disposed in the third emission area LA3 on the third insulating layer PAS3. The light transmission part LTU may be surrounded by the first light blocking member BK1. The light transmission part LTU may transmit incident light therethrough with maintaining a peak wavelength of the incident light. The light transmission part LTU may include a third base resin BS3 and third scatterers SCT3.

The third base resin BS3 may include a material having a relatively high light transmissivity. The third base resin BS3 may be made of a transparent organic material. For example, the third base resin BS3 and the first or second base resin BS1 or BS2 may be made of the same material. For example, the third base resin BS3 may be made of the material of the first base resin BS1.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light. For example, the third scatterer SCT3 and the first or second scatterer SCT1 or SCT2 may be made of the same material. For example, the third scatterer SCT3 may be made of the material of the first scatterer SCT1.

Since the wavelength conversion layer WLCL is disposed (e.g., directly disposed) on the third insulating layer PAS3 of the light emitting element layer EML, the display device 10 may not require a separate substrate for the first and second wavelength conversion parts WLC1 and WLC2 and the light transmission part LTU. Accordingly, the first and second wavelength conversion parts WLC1 and WLC2 and the light transmission part LTU may be readily aligned in the first to third emission areas LA1, LA2, and LA3, respectively, and a thickness of the display device 10 may be relatively decreased.

The second passivation layer PV2 may cover the first and second wavelength conversion parts WLC1 and WLC2, the light transmission part LTU, and the first light blocking member BK1. For example, the second passivation layer PV2 may seal the first and second wavelength conversion parts WLC1 and WLC2 and the light transmission part LTU to prevent damage to (or contamination of) the first and second wavelength conversion parts WLC1 and WLC2 and the light transmission part LTU. For example, the second passivation layer PV2 may include an inorganic material.

The second planarization layer OC2 may be disposed on the second passivation layer PV2 to planarize upper end portions of the first and second wavelength conversion parts WLC1 and WLC2 and the light transmission part LTU. For example, the second planarization layer OC2 may include an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed in the light blocking areas BA on the second planarization layer OC2 of the wavelength conversion layer WLCL. The second light blocking member BK2 may overlap the first light blocking member BK1 or the sub-bank SB in the thickness direction (e.g., Z-axis direction). The second light blocking member BK2 may block transmission of light. The second light blocking member BK2 may improve a color reproduction rate of the display device 10 by preventing colors from being mixed with each other due to permeation of the light between the first to third emission areas LA1, LA2, and LA3. The second light blocking member BK2 may be disposed in the form of a lattice surrounding the first to third emission areas LA1, LA2, and LA3 in plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion part WLC1 in the thickness direction (e.g., Z-axis direction). The first color filter CF1 may selectively transmit light of a first color (e.g., red light) and block or absorb light of a second color (e.g., green light) and light of a third color (e.g., blue light). For example, the first color filter CF1 may be a red color filter and include a red colorant.

The second color filter CF2 may be disposed in the second emission area LA2 on the second planarization layer OC2. The second color filter CF2 may be surrounded by the second light blocking member BK2. The second color filter CF2 may overlap the second wavelength conversion part WLC2 in the thickness direction (e.g., Z-axis direction). The second color filter CF2 may selectively transmit the light of the second color (e.g., the green light) and block or absorb the light of the first color (e.g., the red light) and the light of the third color (e.g., the blue light). For example, the second color filter CF2 may be a green color filter and include a green colorant.

The third color filter CF3 may be disposed in the third emission area LA3 on the second planarization layer OC2. The third color filter CF3 may be surrounded by the second light blocking member BK2. The third color filter CF3 may overlap the light transmission part LTU in the thickness direction (e.g., Z-axis direction). The third color filter CF3 may selectively transmit the light of the third color (e.g., the blue light) and block or absorb the light of the first color (e.g., the red light) and the light of the second color (e.g., the green light). For example, the third color filter CF3 may be a blue color filter and include a blue colorant.

The first to third color filters CF1, CF2, and CF3 may absorb a portion of light introduced from the outside of the display device 10 to reduce reflected light due to external light. Therefore, the first to third color filters CF1, CF2, and CF3 may prevent distortion of colors due to external light reflection.

Since the first to third color filters CF1, CF2, and CF3 are disposed (e.g., directly disposed) on the second planarization layer OC2 of the wavelength conversion layer WLCL, the display device 10 may not require a separate substrate for the first to third color filters CF1, CF2, and CF3. Accordingly, a thickness of the display device 10 may be relatively decreased.

The third passivation layer PV3 may cover the first to third color filters CF1, CF2, and CF3, and the second light blocking member BK2. The third passivation layer PV3 may protect the first to third color filters CF1, CF2, and CF3.

The encapsulation layer TFE may be disposed on the third passivation layer PV3 of the color filter layer CFL. The encapsulation layer TFE may cover an upper surface and side surfaces of the display layer DPL. For example, the encapsulation layer TFE may include at least one inorganic film to prevent permeation of oxygen or moisture. For example, the encapsulation layer TFE may include at least one organic film to protect the display device 10 from foreign matters such as dust.

The anti-reflection film ARF may be disposed on the encapsulation layer TFE. The anti-reflection film ARF may prevent reflection of external light to suppress (or to prevent) a decrease in visibility due to the reflection of the external light. The anti-reflection film ARF may protect an upper surface of the display device 10. In another example, the anti-reflection film ARF may be omitted. As another example, the anti-reflection film ARF may be replaced with a polarizing film.

The flexible films FPCB may be disposed below the first substrate SUB1. The flexible film FPCB may be disposed at an edge portion of a lower surface of the display device 10. The flexible film FPCB may be attached to a lower surface of the first substrate SUB1 by using an adhesive member ADM. The flexible film FPCB may include the lead electrode LDE disposed on an upper surface of a side of the flexible film FPCB. The lead electrode LDE may be inserted into the first contact hole CNT1 to be connected (e.g., electrically connected) to the pad part PAD through the connection film ACF. The flexible film FPCB may support the display driver DIC disposed on a lower surface of another side of the flexible film FPCB. The lead electrode LDE may be connected (e.g., electrically connected) to the display driver DIC through a lead line disposed on the lower surface of the flexible film FPCB. The another side of the flexible film FPCB may be connected to a source circuit board below the first substrate SUB1. The flexible film FPCB may transmit a signal and a voltage of the display driver DIC to the display device 10.

The connection film ACF may attach (or connect) the lead electrode LDE of the flexible film FPCB to the pad part PAD. A surface of the connection film ACF may be attached to the pad part PAD, and another surface of the connection film ACF may be attached (or connected) to the lead electrode LDE. For example, the connection film ACF may include an anisotropic conductive film. In case that the connection film ACF includes the anisotropic conductive film, the connection film ACF may have conductivity in regions with which the pad part PAD and the lead electrode LDE are in contact, and may connect (e.g., electrically connect) the flexible film FPCB to the fan-out line FOL.

The display driver DIC may be mounted on the flexible film FPCB. The display driver DIC may be an integrated circuit (IC). The display driver DIC may convert digital video data into an analog data voltage based on a data control signal received from a timing controller, and may supply the analog data voltage to the data line of the display area DA through the flexible film FPCB. The display driver DIC may supply a source voltage received from a power supply unit to the power line of the display area DA through the flexible film FPCB. The display driver DIC may generate gate signals based on gate control signals, and may sequentially supply the gate signals to gate lines according to a set order. The display device 10 may include the fan-out line FOL disposed on the first substrate SUB1 and the display driver DIC disposed below the first substrate SUB1, such that an area of the non-display area NDA may be minimized.

Figure 3:
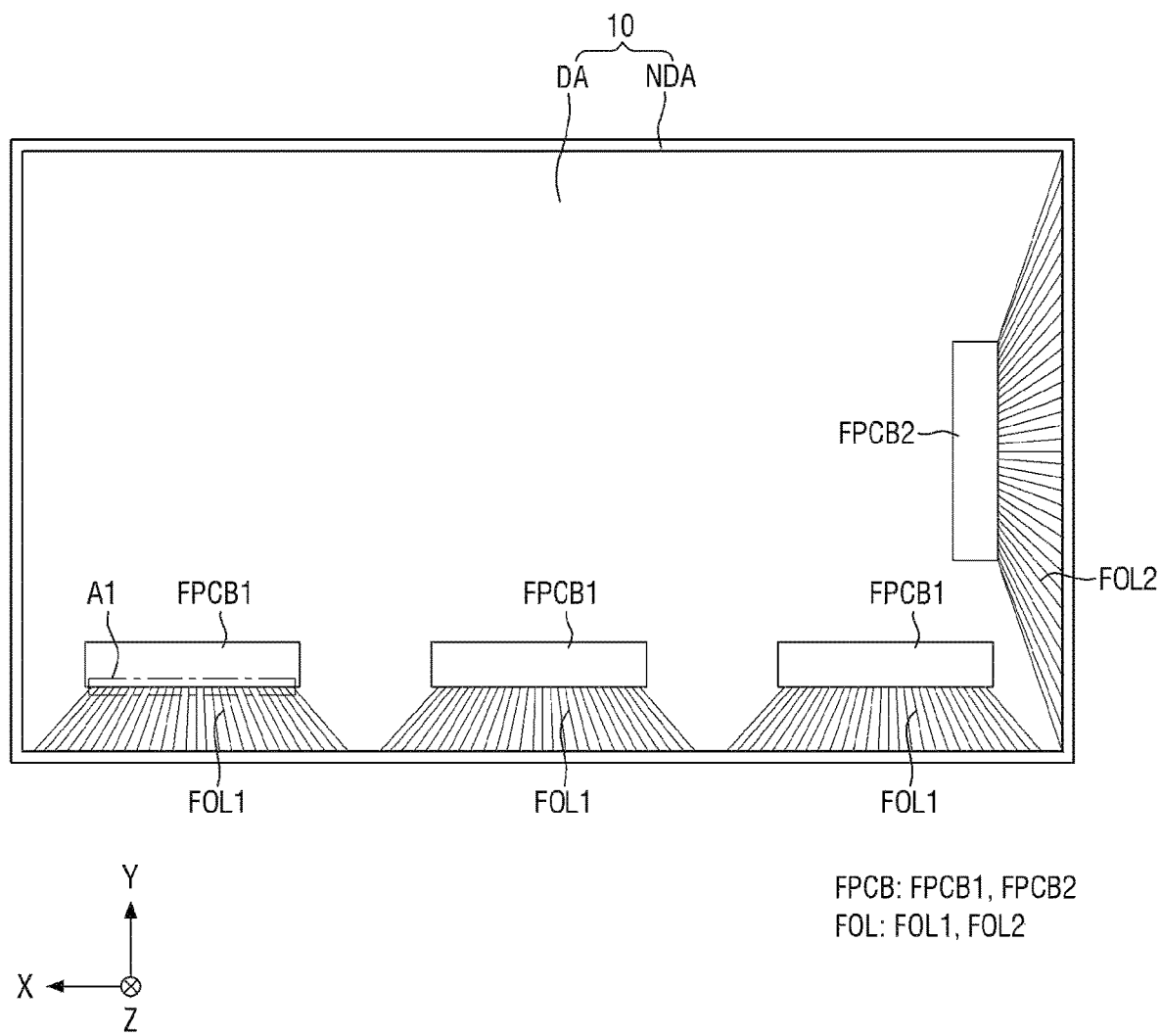
FIG. 3 is a schematic bottom view illustrating a display device according to an embodiment.

FIG. 3 is a schematic bottom view illustrating a display device according to an embodiment.

Referring to FIG. 3, the flexible film FPCB and the fan-out line FOL may be disposed in the display area DA.

The flexible film FPCB may be disposed below the first substrate SUB1. The flexible film FPCB may be disposed at an edge portion of a lower surface of the display device 10. The flexible film FPCB may include first and second flexible films FPCB1 and FPCB2. The first flexible films FPCB1 may be disposed at an edge portion of a long side of the display device 10, and the second flexible film FPCB2 may be disposed at an edge portion of a short side of the display device 10. The first flexible films FPCB1 may supply data voltages and source voltages, and the second flexible film FPCB2 may supply gate signals, but embodiments are not limited thereto.

The fan-out line FOL may be integral with the pad part PAD. The fan-out line FOL may include first and second fan-out lines FOL1 and FOL2. The first fan-out lines FOL1 may extend from the pad parts PAD connected to the flexible film FPCB to an edge portion of the display device 10 or the first substrate SUB1. For example, the first fan-out lines FOL1 may be disposed at the edge portion of the long side of the display device 10 and extend in a direction opposite to the second direction (e.g., Y-axis direction). The second fan-out lines FOL2 may be disposed at the edge portion of the short side of the display device 10 and extend in a direction opposite to the first direction (e.g., X-axis direction). The first fan-out lines FOL1 may be connected (e.g., electrically connected) to data lines or power lines of the display area DA through connection parts CWL, and the second fan-out lines FOL2 may be connected (e.g., electrically connected) to gate lines of the display area DA through connection parts CWL.

Figure 4:
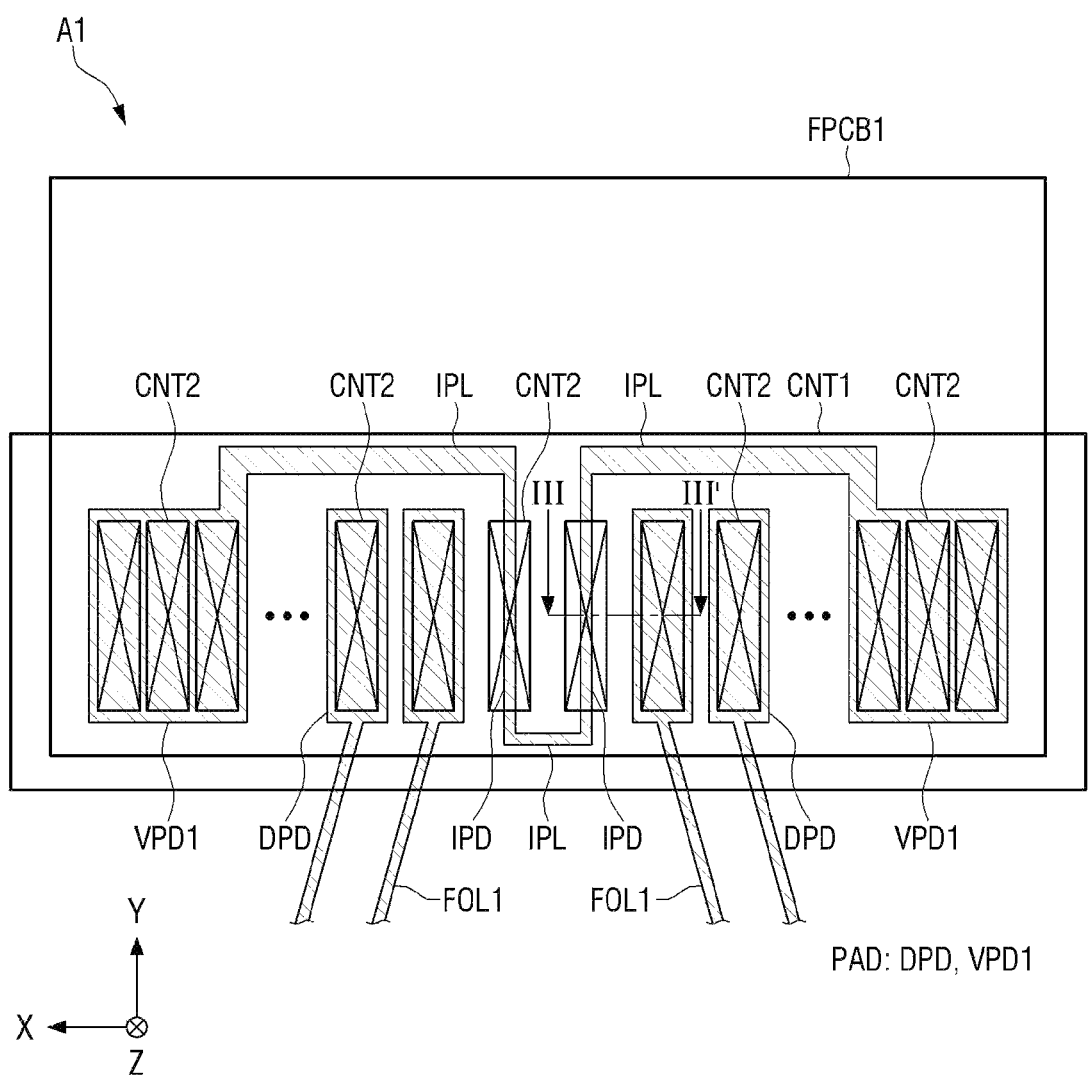
FIG. 4 is a schematic enlarged view of an area A1 of FIG. 3.
Figure 5:
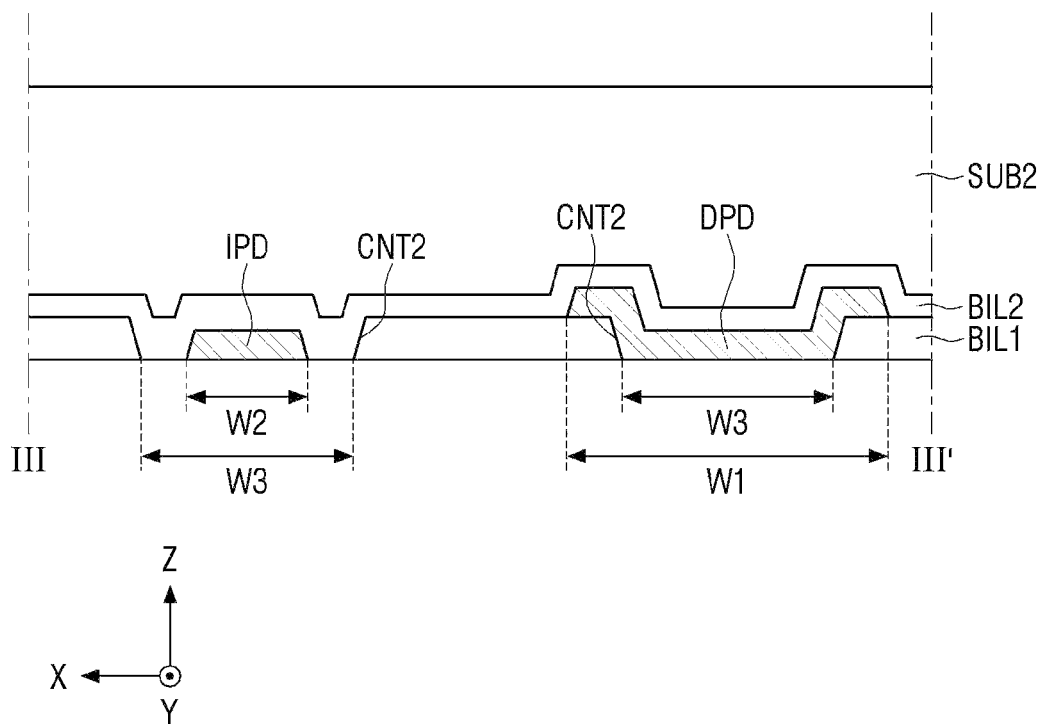
FIG. 5 is a schematic cross-sectional view taken along line of FIG. 4.

FIG. 4 is a schematic enlarged view of an area A1 of FIG. 3, and FIG. 5 is a schematic cross-sectional view taken along line of FIG. 4.

Referring to FIGS. 4 and 5, the pad part PAD and inspection pad parts IPD may be exposed through the first contact hole CNT1 of the first substrate SUB1. The pad part PAD may include data pad parts DPD and first power pad parts VPD1. The data pad parts DPD may be integral with the first fan-out lines FOL1 and inserted into the second contact holes CNT2. A first width W1 of the data pad part DPD may be greater than a third width W3 of the second contact hole CNT2.

First power pad parts VPD1 may be connected (e.g., electrically connected) to each other through inspection lines IPL and the inspection pad parts IPD. One first power pad part VPD1 may be inserted into second contact holes CNT2. The first power pad part VPD1 disposed on (or adjacent to) a side of the first contact hole CNT1 may be connected (e.g., electrically connected) to the first power pad part VPD1 disposed on (or adjacent to) another side of the first contact hole CNT1 through the inspection lines IPL and at least one inspection pad part IPD.

The inspection lines IPL may connect (e.g., electrically connect) at least one inspection pad part IPD to the first power pad parts VPD1. The inspection line IPL may be integral with at least one inspection pad part IPD. The inspection line IPL and the first fan-out line FOL1 may be disposed at the same level or formed of the same layer. The inspection line IPL may be disposed on the first barrier insulating layer BIL1 to be protected by the first barrier insulating layer BIL1 in a process of etching the first substrate SUB1. The inspection line IPL may overlap the first contact hole CNT1, but a position of the inspection line IPL is not limited thereto.

At least one inspection pad part IPD may be disposed between the data pad parts DPD, but a position of the inspection pad part IPD is not limited thereto. At least one inspection pad part IPD may be connected between the inspection lines IPL. The inspection pad part IPD may be inserted into the second contact hole CNT2, and the second contact hole CNT2 may surround the inspection pad parts IPD so as to be spaced apart from the inspection pad part IPD. Accordingly, a second width W2 of the inspection pad part IPD may be smaller than the third width W3 of the second contact hole CNT2.

The second barrier insulating layer BIL2 may be disposed on the first barrier insulating layer BIL1 the pad part PAD, and the inspection pad part IPD. The second barrier insulating layer BIL2 may cover an area between the inspection pad part IPD and the first barrier insulating layer BIL1 spaced apart from each other. Accordingly, the second barrier insulating layer BIL2 may fill a portion of the second contact hole CNT2 in which the inspection pad part IPD is not disposed.

As another example, the second contact hole CNT2 into which the data pad part DPD is inserted and the second contact hole CNT2 into which the inspection pad part IPD is inserted may have different widths. For example, the first width W1 of the data pad part DPD may be greater than the width of the second contact hole CNT2, and the second width W2 of the inspection pad part IPD may be smaller than the width of the second contact hole CNT2.

In case that the first substrate SUB1 is normally etched in a process of forming the first contact hole CNT1, a portion of the data pad part DPD and the inspection pad part IPD inserted into the second contact holes CNT2 may not be damaged. The inspection pad part IPD may have conductivity, and may connect (e.g., electrically connect) the first power pad parts VPD1 disposed on (or adjacent to) sides (e.g., opposite sides) of the first contact hole CNT1 to each other. An inspection device may provide an inspection pin for an electrical inspection into contact with each of the first power pad parts VPD1, and measure resistance between the first power pad parts VPD1. In case that the inspection pad part IPD is not damaged, the resistance between the first power pad parts VPD1 may have an appropriate resistance value (or a reference resistance value), and the inspection device may decide that the inspection pad part IPD is in a normal state. In case that the inspection pad part IPD is in the normal state, the inspection device may decide that the pad part PAD is also in a normal state as the pad part PAD and the inspection pad part IPD are formed of the same layer or disposed at the same level. The flexible film FPCB may be attached onto the pad part PAD of the display device 10 in the normal state.

In case that the first substrate SUB1 is excessively etched in the process of forming the first contact hole CNT1, a portion of the data pad part DPD and the inspection pad part IPD inserted into the second contact holes CNT2 may be damaged. The first barrier insulating layer BIL1 may protect another portion of the data pad part DPD that is not inserted into the second contact hole CNT2 in the process of etching the first substrate SUB1. Accordingly, even though a portion of the data pad part DPD inserted into the second contact hole CNT2 is damaged, the data pad part DPD may have conductivity and may be connected (e.g., electrically connected) to the first fan-out line FOL1.

The inspection pad part IPD may not be protected by the first barrier insulating layer BIL1 and may thus lose conductivity in case that it is damaged in the process of etching the first substrate SUB1. Accordingly, in case that the inspection pad part IPD is damaged, the inspection pad part IPD may be unable to connect (e.g., electrically connect) the first power pad parts VPD1 disposed on (or adjacent to) sides (e.g., opposite sides) of the first contact hole CNT1 to each other. The inspection device may provide the inspection pin for an electrical inspection into contact with each of the first power pad parts VPD1, and measure the resistance between the first power pad parts VPD1. In case that the inspection pad part IPD is damaged, the resistance between the first power pad parts VPD1 may be excessively high, and the inspection device may decide that the inspection pad part IPD is damaged. In case that the inspection pad part IPD is damaged, the inspection device may decide that the pad part PAD is damaged as the pad part PAD and the inspection pad part IPD are formed of the same layer or disposed at the same level. The display device 10 may include the inspection pad part IPD having the width smaller than that of the second contact hole CNT2, and thus, may precisely decide that the inspection pad part IPD and the pad part PAD are damaged before the flexible film FPCB is attached. Accordingly, the display device 10 may reduce an inspection time, reduce a bonding material such as the flexible film FPCB, and increase a yield (or a productivity) by quickly deciding defective products that may not be confirmed with the naked eye.

Figure 6:
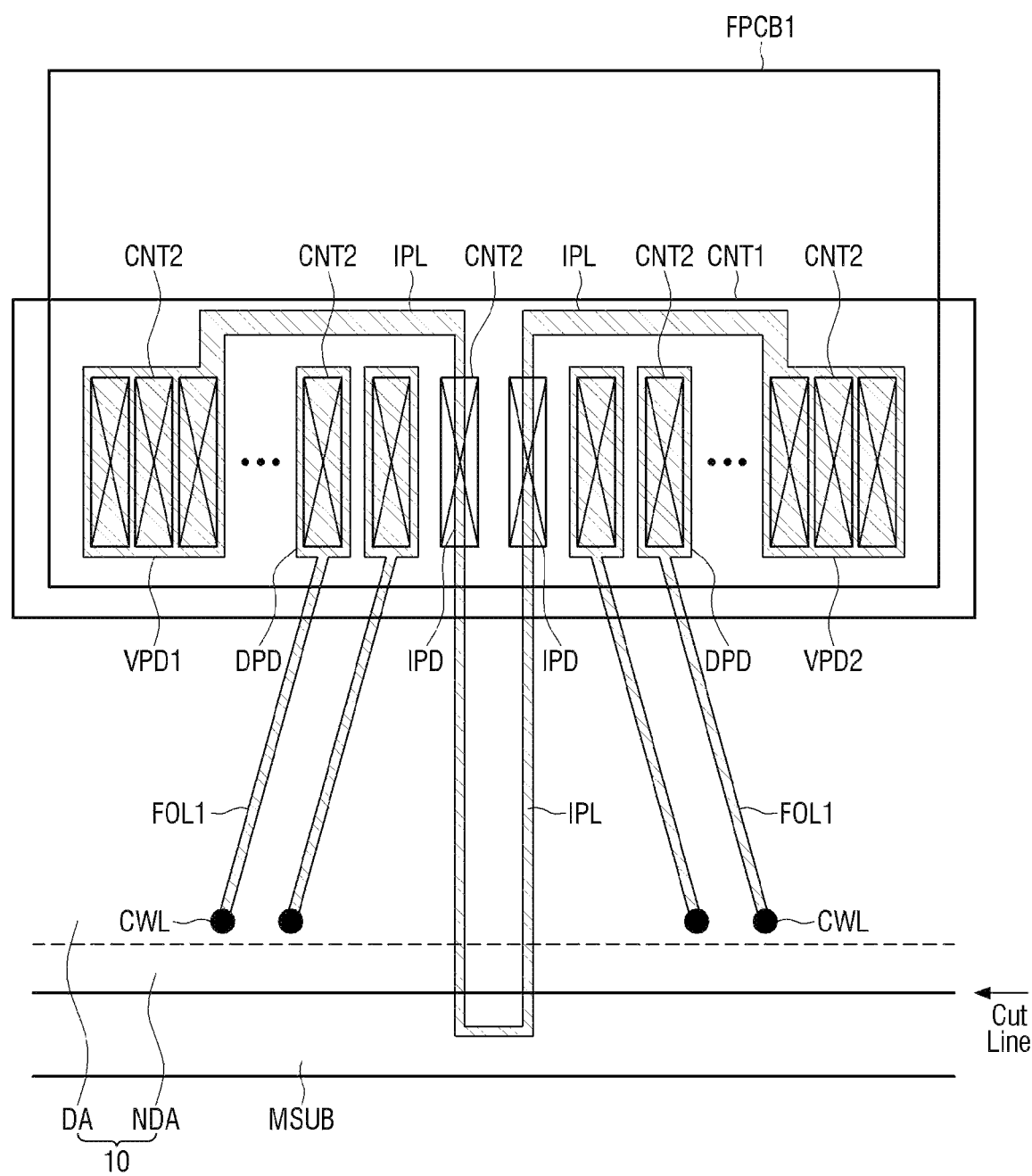
FIG. 6 is an enlarged bottom view illustrating a portion of a display device according to another embodiment.

FIG. 6 is a schematic enlarged bottom view illustrating a portion of a display device according to another embodiment. A display device of FIG. 6 is different in configurations of a second power pad part VPD2 and inspection lines IPL from the display device of FIG. 4, and the same configurations as the configurations described above will be briefly described or a description thereof will be omitted.

Referring to FIG. 6, the pad part PAD and the inspection pad parts IPD may be exposed through the first contact hole CNT1 of the first substrate SUB1. The pad part PAD may include data pad parts DPD, a first power pad part VPD1, and a second power pad part VPD2. The data pad parts DPD may be integral with the first fan-out lines FOL1 and inserted into the second contact holes CNT2. A first width W1 of the data pad part DPD may be greater than a third width W3 of the second contact hole CNT2.

The first and second power pad parts VPD1 and VPD2 may be connected (e.g., electrically connected) to each other through the inspection lines IPL and the inspection pad parts IPD. Each of the first and second power pad parts VPD1 and VPD2 may be inserted into second contact holes CNT2. The first and second power pad parts VPD1 and VPD2 may be connected (e.g., electrically connected) to each other through the inspection lines IPL and at least one inspection pad part IPD.

The inspection lines IPL may connect (e.g., electrically connect) at least one inspection pad part IPD to the first power pad parts VPD1. The inspection line IPL may be integral with at least one inspection pad part IPD. The inspection line IPL and the first fan-out line FOL1 may be disposed at the same level or formed of the same layer. The inspection line IPL may be disposed on the first barrier insulating layer BIL1 to be protected by the first barrier insulating layer BIL1 in a process of etching the first substrate SUB. The inspection line IPL may extend from the first contact hole CNT1 to the non-display area NDA and a mother substrate MSUB. Display devices 10 on the mother substrate MSUB may be cut along a cut line after inspection of the inspection pad part IPD, and a portion of the inspection line IPL may be removed. Accordingly, in case that it is decided that the inspection pad part IPD is in a normal state, the first and second power pad parts VPD1 and VPD2 may be electrically insulated from each other by cutting of the inspection line IPL. The flexible film FPCB may be attached onto the pad part PAD of the display device 10 in the normal state.

At least one inspection pad part IPD may be disposed between the data pad parts DPD, but a position of the inspection pad part IPD is not limited thereto. At least one inspection pad part IPD may be connected between the inspection lines IPL. The inspection pad part IPD may be inserted into the second contact hole CNT2, and the second contact hole CNT2 may surround the inspection pad parts IPD so as to be spaced apart from the inspection pad part IPD. Accordingly, a second width W2 of the inspection pad part IPD may be smaller than the third width W3 of the second contact hole CNT2.

The second barrier insulating layer BIL2 may be disposed on the first barrier insulating layer BIL1 the pad part PAD, and the inspection pad part IPD. The second barrier insulating layer BIL2 may cover an area between the inspection pad part IPD and the first barrier insulating layer BIL1 spaced apart from each other. Accordingly, the second barrier insulating layer BIL2 may fill a portion of the second contact hole CNT2 in which the inspection pad part IPD is not disposed.

As another example, the second contact hole CNT2 into which the data pad part DPD is inserted and the second contact hole CNT2 into which the inspection pad part IPD is inserted may have different widths. For example, the first width W1 of the data pad part DPD may be greater than the width of the second contact hole CNT2, and the second width W2 of the inspection pad part IPD may be smaller than the width of the second contact hole CNT2.

In case that the first substrate SUB1 is normally etched in a process of forming the first contact hole CNT1, a portion of the data pad part DPD and the inspection pad part IPD inserted into the second contact holes CNT2 may not be damaged. The inspection pad part IPD may have conductivity, and may connect (e.g., electrically connect) the first and second power pad parts VPD1 and VPD2 to each other The inspection device may provide an inspection pin for an electrical inspection into contact with each of the first and second power pad parts VPD1 and VPD2, and measure resistance between the first and second power pad parts VPD1 and VPD2. In case that the inspection pad part IPD is not damaged, the resistance between the first and second power pad parts VPD1 and VPD2 may have an appropriate resistance value (or a reference resistance value), and the inspection device may decide that the inspection pad part IPD is in a normal state. In case that the inspection pad part IPD is in the normal state, the inspection device may decide that the pad part PAD is also in a normal state as the pad part PAD and the inspection pad part IPD are formed of the same layer or disposed at the same level. The flexible film FPCB may be attached (or connected) onto the pad part PAD of the display device 10 in the normal state.

In case that the first substrate SUB1 is excessively etched in the process of forming the first contact hole CNT1, a portion of the data pad part DPD and the inspection pad part IPD inserted into the second contact holes CNT2 may be damaged. The first barrier insulating layer BIL1 may protect another portion of the data pad part DPD that is not inserted into the second contact hole CNT2 in the process of etching the first substrate SUB1. Accordingly, even though a portion of the data pad part DPD inserted into the second contact hole CNT2 is damaged, the data pad part DPD may have conductivity and may be connected (e.g., electrically connected) to the first fan-out line FOL1.

The inspection pad part IPD may not be protected by the first barrier insulating layer BIL1 and may thus lose conductivity in case that it is damaged in the process of etching the first substrate SUB1. Accordingly, in case that the inspection pad part IPD is damaged, the inspection pad part IPD may be unable to connect (e.g., electrically connect) the first and second power pad parts VPD1 and VPD2 to each other. The inspection device may provide the inspection pin for an electrical inspection into contact with each of the first and second power pad parts VPD1 and VPD2, and measure the resistance between the first and second power pad parts VPD1 and VPD2. In case that the inspection pad part IPD is damaged, the resistance between the first and second power pad parts VPD1 and VPD2 may be excessively high, and the inspection device may decide that the inspection pad part IPD is damaged. In case that the inspection pad part IPD is damaged, the inspection device may decide that the pad part PAD is damaged as the pad part PAD and the inspection pad part IPD are formed of the same layer or disposed at the same level. The display device 10 may include the inspection pad part IPD having the width smaller than that of the second contact hole CNT2, and thus, may precisely decide that the inspection pad part IPD and the pad part PAD are damaged before the flexible film FPCB is attached. Accordingly, the display device 10 may save an inspection time, save a bonding material such as the flexible film FPCB, and increase a yield and a productivity by quickly deciding defective products that may not be confirmed with the naked eye.

Figure 7:
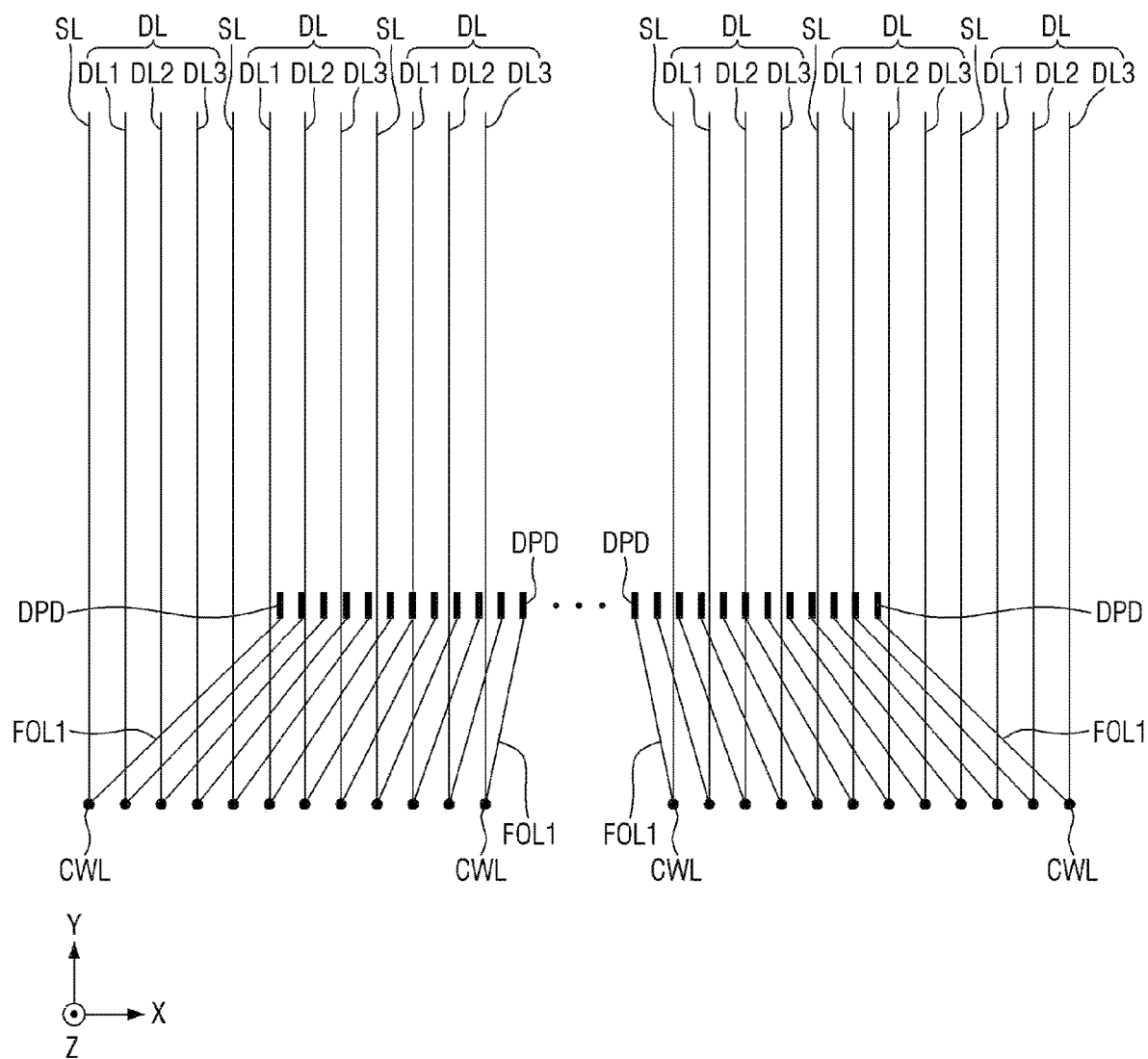
FIG. 7 is a schematic view illustrating data pad parts, first fan-out lines, sensing lines, and data lines in the display device according to an embodiment.
Figure 8:
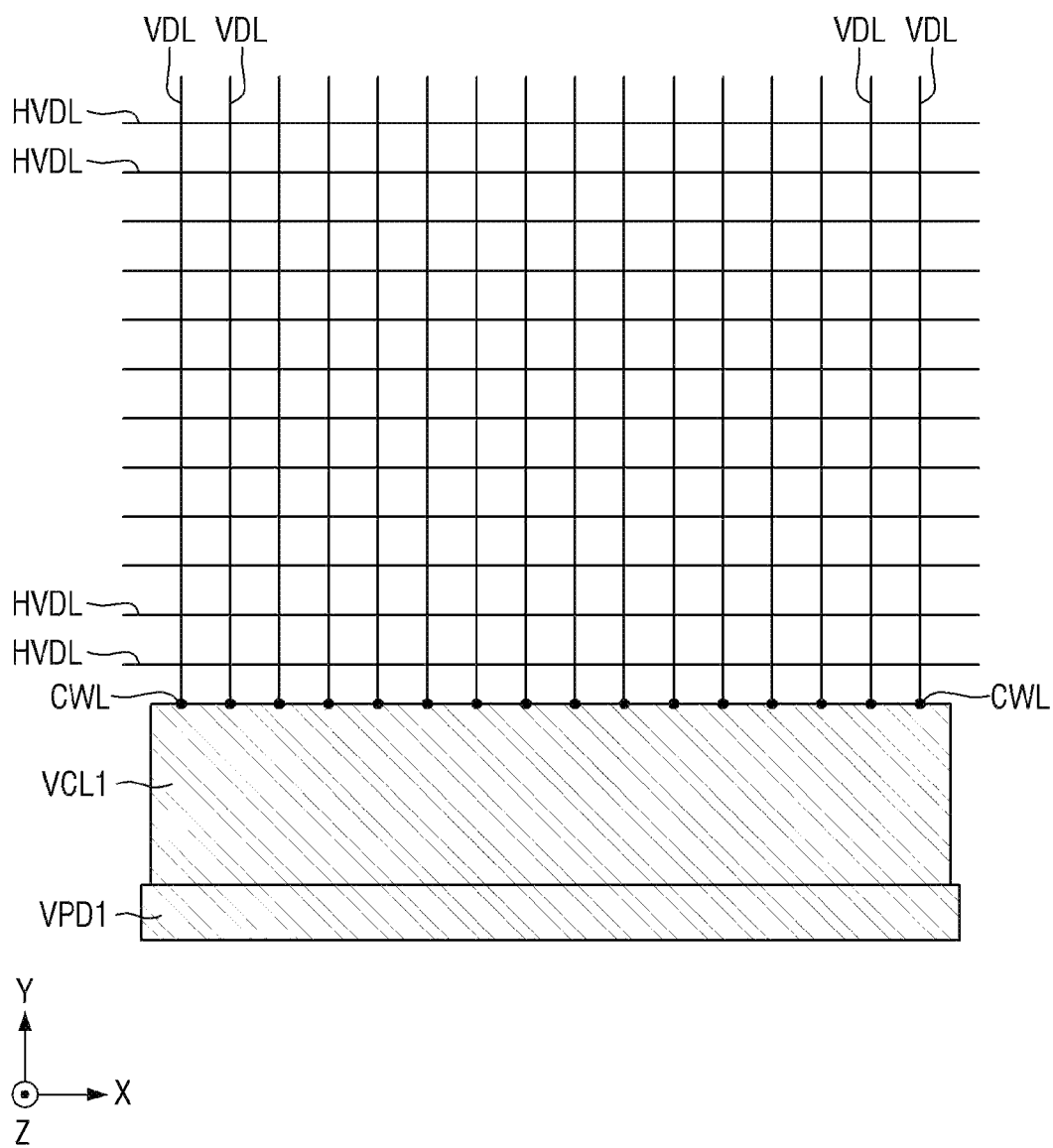
FIG. 8 is a schematic view illustrating a first power pad part, a first power connection line, high potential lines, and horizontal voltage lines in the display device according to an embodiment.
Figure 9:
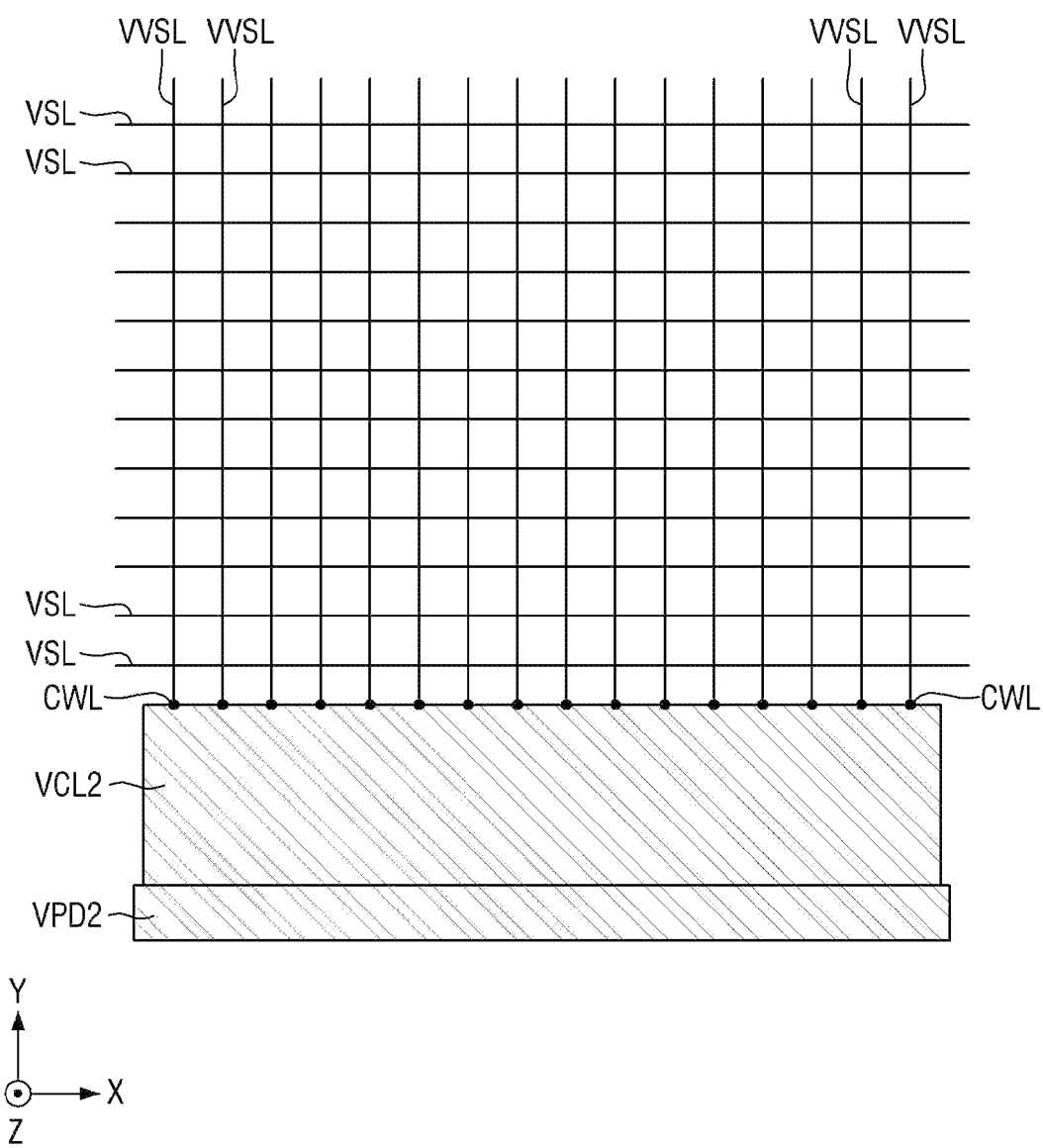
FIG. 9 is a schematic view illustrating a second power pad part, a second power connection line, low potential lines, and vertical voltage lines in the display device according to an embodiment.
Figure 10:
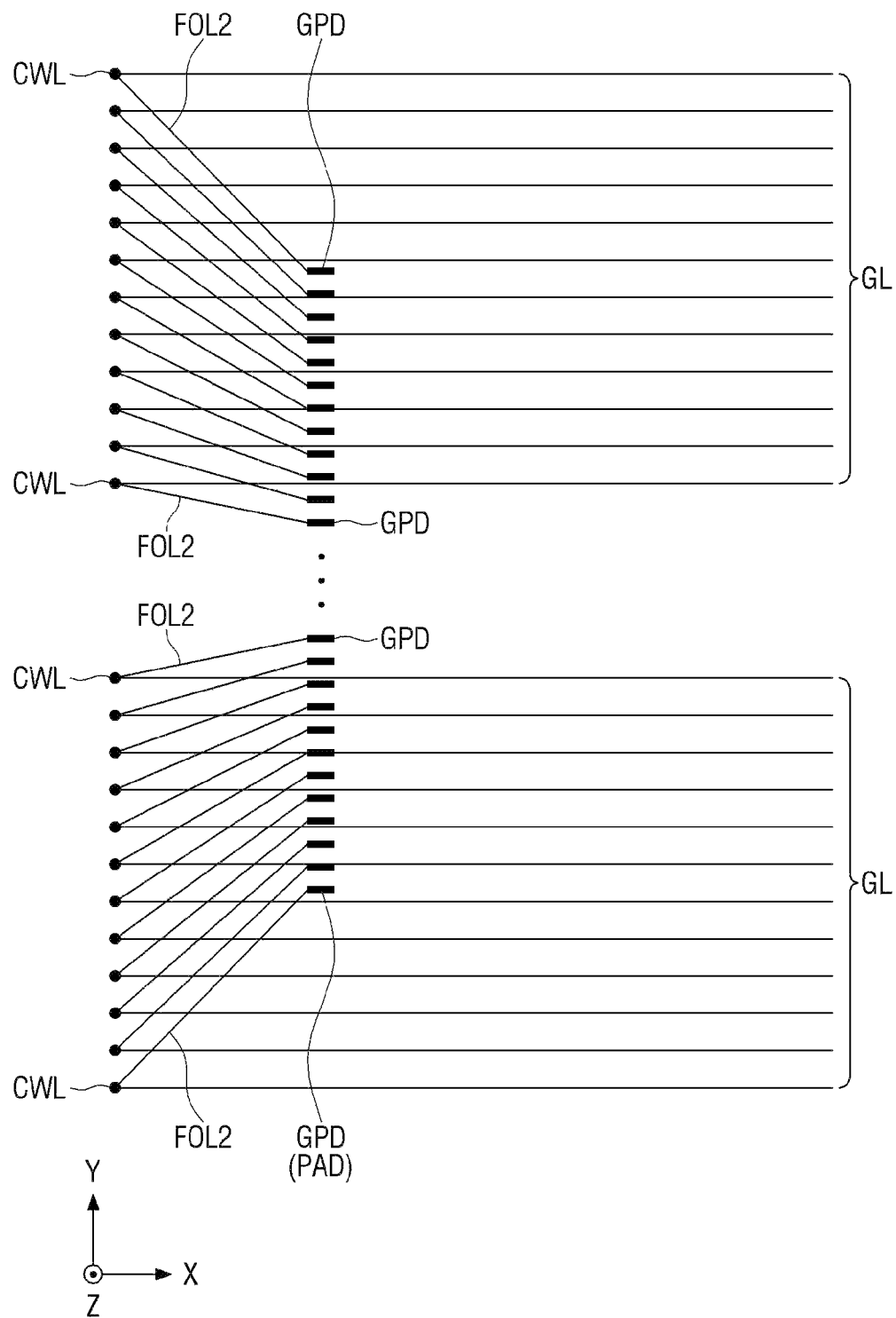
FIG. 10 is a schematic view illustrating gate pad parts, second fan-out lines, and gate lines in the display device according to an embodiment.

FIG. 7 is a schematic view illustrating data pad parts, first fan-out lines, sensing lines, and data lines in the display device according to an embodiment, and FIG. 8 is a schematic view illustrating a first power pad part, a first power connection line, high potential lines, and horizontal voltage lines in the display device according to an embodiment. FIG. 9 is a schematic view illustrating a second power pad part, a second power connection line, low potential lines, and vertical voltage lines in the display device according to an embodiment, and FIG. 10 is a schematic view illustrating gate pad parts, second fan-out lines, and gate lines in the display device according to an embodiment.

Referring to FIGS. 7, 8, 9, and 10, the display area DA may include sensing lines SL, data lines DL, high potential lines VDL, horizontal voltage lines HVDL, low potential lines VSL, vertical voltage lines VVSL, and gate lines GL.

Sensing lines SL may extend in the second direction (e.g., Y-axis direction) and may be spaced apart from each other in the first direction (e.g., X-axis direction). Referring to FIG. 2, the sensing line SL may be formed of (or included in) the second metal layer MTL2 and extend in the second direction (e.g., Y-axis direction). The sensing line SL may be connected (e.g., electrically connected) to the first fan-out line FOL1 of the first metal layer MTL1 through the connection part CWL. The sensing line SL may cross the first fan-out line FOL1 in plan view. The sensing line SL may receive an initialization voltage through the data pad part DPD. The sensing line SL may provide a sensing signal to the data pad part DPD.

The data line DL may include first to third data lines DL1, DL2, and DL3. The first to third data lines DL1, DL2, and DL3 may extend in the second direction (e.g., Y-axis direction) and may be spaced apart from each other in the first direction (e.g., X-axis direction). Referring to FIG. 2, the data line DL may be formed of (or included in) the second metal layer MTL2 and extend in the second direction (e.g., Y-axis direction). The data line DL may be connected (e.g., electrically connected) to the first fan-out line FOL1 of the first metal layer MTL1 through the connection part CWL. The data line DL may cross the first fan-out line FOL1 in plan view. The data line DL may receive a data voltage through the data pad part DPD.

High potential lines VDL may extend in the second direction (e.g., Y-axis direction) and may be spaced apart from each other in the first direction (e.g., X-axis direction). The high potential lines VDL may be connected to the horizontal voltage lines HVDL crossing the high potential lines VDL, and may supply high potential voltages to the horizontal voltage lines HVDL. Referring to FIG. 2, the high potential line VDL may be formed of (or included in) the second metal layer MTL2 and extend in the second direction (e.g., Y-axis direction). The high potential line VDL may be connected (e.g., electrically connected) to a first power connection line VCL1 of the first metal layer MTL1 through the connection part CWL. The high potential line VDL may receive the high potential voltage through the first power pad part VPD1.

Horizontal voltage lines HVDL may extend in the first direction (e.g., X-axis direction) and may be spaced apart from each other in the second direction (e.g., Y-axis direction). The horizontal voltage lines HVDL may be connected to the high potential lines VDL crossing the horizontal voltage lines HVDL, and may receive the high potential voltages from the high potential lines VDL. Referring to FIG. 2, the horizontal voltage line HVDL may be formed of (or included in) the fourth metal layer MTL4 and extend in the first direction (e.g., X-axis direction).

Vertical voltage lines VVSL may extend in the second direction (e.g., Y-axis direction) and may be spaced apart from each other in the first direction (e.g., X-axis direction). The vertical voltage lines VVSL may be connected to the low potential lines VSL crossing the vertical voltage lines VVSL, and may supply low potential voltages to the low potential lines VSL. Referring to FIG. 2, the vertical voltage line VVSL may be formed of (or included in) the second metal layer MTL2 and extend in the second direction (e.g., Y-axis direction). The vertical voltage line VVSL may be connected (e.g., electrically connected) to a second power connection line VCL2 of the first metal layer MTL1 through the connection part CWL. The vertical voltage line VVSL may receive the low potential voltage through the second power pad part VPD2.

Low potential lines VSL may extend in the first direction (e.g., X-axis direction) and may be spaced apart from each other in the second direction (e.g., Y-axis direction). The low potential lines VSL may be connected to the vertical voltage lines VVSL crossing the low potential lines VSL, and may receive the low potential voltages from the vertical voltage lines VVSL. Referring to FIG. 2, the low potential line VSL may be formed of (or included in) the fourth metal layer MTL4 and extend in the first direction (e.g., X-axis direction).

Gate lines GL may extend in the first direction (e.g., X-axis direction) and may be spaced apart from each other in the second direction (e.g., Y-axis direction). Referring to FIG. 2, the gate line GL may be formed of (or included in) the third metal layer MTL3 (or the fourth metal layer MTL4) and extend in the first direction (e.g., X-axis direction). The gate line GL may be connected (e.g., electrically connected) to the second fan-out line FOL2 of the first metal layer MTL1 through the connection part CWL. The gate line GL may cross the second fan-out line FOL2 in plan view. The gate line GL may receive a gate signal through a gate pad part GPD.

Figure 11:
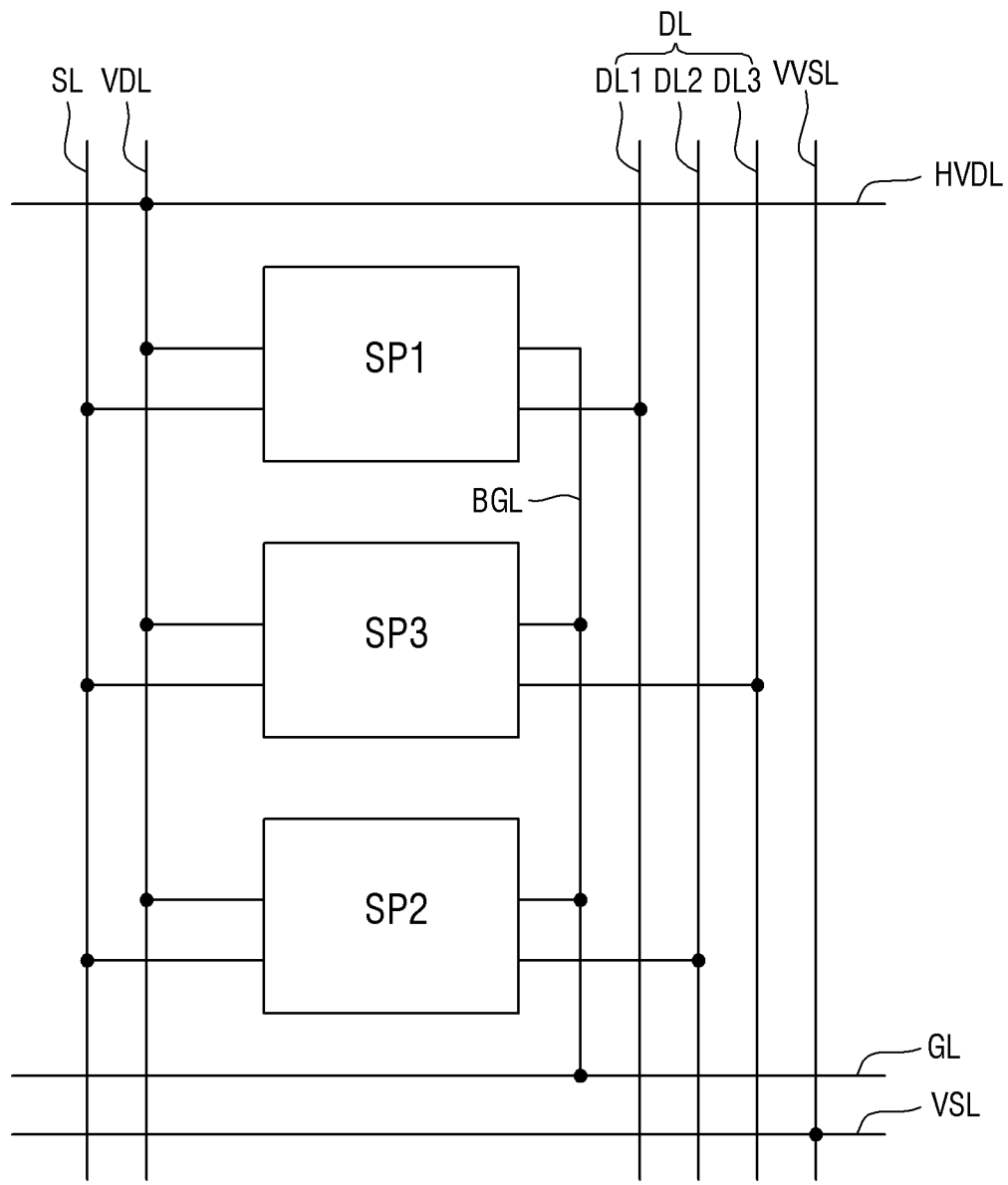
FIG. 11 is a block diagram illustrating pixels and lines of the display device according to an embodiment.
Figure 12:
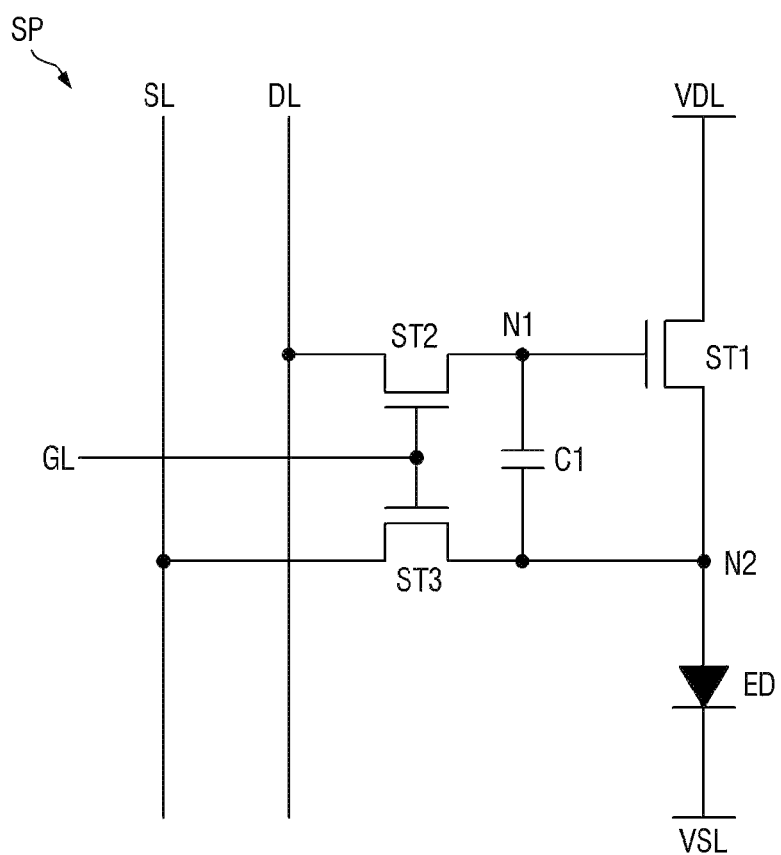
FIG. 12 is a schematic diagram of an equivalent circuit of the pixel of FIG. 11.

FIG. 11 is a block diagram illustrating pixels and lines of the display device according to an embodiment, and FIG. 12 is a schematic diagram of an equivalent circuit of the pixel of FIG. 11.

Referring to FIGS. 11 and 12, the pixels SP may include first to third pixels SP1, SP2, and SP3. A pixel circuit of the first pixel SP1, a pixel circuit of the third pixel SP3, and a pixel circuit of the second pixel SP2 may be arranged in a direction opposite to the second direction (e.g., Y-axis direction), but the order of the pixel circuits is not limited thereto.

Each of the first to third pixels SP1, SP2, and SP3 may be connected (e.g., electrically connected) to the high potential line VDL, the sensing line SL, the gate line GL, and the data line DL.

The high potential line VDL may extend in the second direction (e.g., Y-axis direction). The high potential line VDL may be disposed on the lower side of the pixel circuits of the first to third pixels SP1, SP2, and SP3. The high potential line VDL may supply a high potential voltage to a transistor of each of the first to third pixels SP1, SP2, and SP3.

The horizontal voltage line HVDL may extend in the first direction (e.g., X-axis direction). The horizontal voltage line HVDL may be disposed on the upper side of the pixel circuit of the first pixel SP1. The horizontal voltage line HVDL may be connected to the high potential line VDL. The horizontal voltage line HVDL may receive a high potential voltage from the high potential line VDL.

The sensing line SL may extend in the second direction (e.g., Y-axis direction). The sensing line SL may be disposed on the left side of the high potential line VDL (e.g., in plan view). The sensing line SL may supply an initialization voltage to the pixel circuit of each of the first to third pixels SP1, SP2, and SP3. The sensing line SL may receive a sensing signal from each of the pixel circuits of the first to third pixels SP1, SP2, and SP3 and supply the sensing signal to the display driver DIC.

The gate line GL may extend in the first direction (e.g., X-axis direction). Referring to FIG. 2, the gate line GL may be formed of (or included in) the third metal layer MTL3 or the fourth metal layer MTL4. The gate line GL may be disposed on the lower side of the pixel circuit of the second pixel SP2. The gate line GL may be disposed on the upper side of the low potential line VSL. The gate line GL may supply a gate signal to an auxiliary gate line BGL.

The auxiliary gate line BGL may extend in the second direction (e.g., Y-axis direction) from the gate line GL. Referring to FIG. 2, the auxiliary gate line BGL may be formed of (or included in) the third metal layer MTL3. A portion of the auxiliary gate line BGL may be a gate electrode GE of a second transistor ST2, and another portion of the auxiliary gate line BGL may be a gate electrode GE of a third transistor ST3. The auxiliary gate line BGL may be disposed on the right side of the pixel circuits of the first to third pixels SP1, SP2, and SP3 (e.g., in plan view). The auxiliary gate line BGL may supply the gate signal received from the gate line GL to the pixel circuits of the first to third pixels SP1, SP2, and SP3.

The data line DL may extend in the second direction (e.g., Y-axis direction). The data line DL may supply a data voltage to the pixel SP. The data line DL may include first to third data lines DL1, DL2, and DL3.

The first data line DL1 may extend in the second direction (e.g., Y-axis direction). The first data line DL1 may be disposed on the right side of the auxiliary gate line BGL (e.g., in plan view). The first data line DL1 may supply the data voltage received from the display driver DIC to the pixel circuit of the first pixel SP1.

The second data line DL2 may extend in the second direction (e.g., Y-axis direction). The second data line DL2 may be disposed on the right side of the first data line DL1 (e.g., in plan view). The second data line DL2 may supply the data voltage received from the display driver DIC to the pixel circuit of the second pixel SP2.

The third data line DL3 may extend in the second direction (e.g., Y-axis direction). The third data line DL3 may be disposed on the right side of the second data line DL2 (e.g., in plan view). The third data line DL3 may supply the data voltage received from the display driver DIC to the pixel circuit of the third pixel SP3.

The vertical voltage line VVSL may extend in the second direction (e.g., Y-axis direction). The vertical voltage line VVSL may be disposed on the right side of the third data line DL3 (e.g., in plan view). The vertical voltage line VVSL may be connected to the low potential line VSL, and may supply a low potential voltage to the low potential line VSL.

The low potential line VSL may extend in the first direction (e.g., X-axis direction). The low potential line VSL may be disposed on the lower side of the gate line GL. The low potential line VSL may supply the low potential voltage received from the vertical voltage line VVSL to light emitting elements ED of the first to third pixels SP1, SP2, and SP3.

Each of the first to third pixels SP1, SP2, and SP3 may include a pixel circuit and a light emitting element ED. The pixel circuit of each of the first to third pixels SP1, SP2, and SP3 may include first to third transistors ST1, ST2, and ST3 and a first capacitor C1.

The first transistor ST1 may include a gate electrode, a drain electrode, and a source electrode. The gate electrode of the first transistor ST1 may be connected to a first node N1, the drain electrode of the first transistor ST1 may be connected to the high potential line VDL, and the source electrode of the first transistor ST1 may be connected to a second node N2. The first transistor ST1 may control a drain-source current (or a driving current) based on a data voltage applied to the gate electrode.

The light emitting element ED may include at least one light emitting element ED. In case that the light emitting element ED includes light emitting elements ED, the light emitting elements ED may be connected to each other in series or in parallel. The light emitting element ED may receive the driving current from the first transistor ST1 to emit light. A light emission amount or luminance of the light emitting element ED may be proportional to a magnitude of the driving current. The light emitting element ED may be an inorganic light emitting element including an inorganic semiconductor, but embodiments are not limited thereto.

A first electrode of the light emitting element ED may be connected to the second node N2, and a second electrode of the light emitting element ED may be connected to the low potential line VSL. The first electrode of the light emitting element ED may be connected to the source electrode of the first transistor ST1, a drain electrode of the third transistor ST3, and a second capacitor electrode of the first capacitor C1 through the second node N2.

The second transistor ST2 may be turned on by a gate signal of the gate line GL to connect (e.g., electrically connect) the data line DL and the first node N1, which is the gate electrode of the first transistor ST1, to each other. The second transistor ST2 may be turned on based on the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1.

The third transistor ST3 may be turned on by a gate signal of the gate line GL to connect (e.g., electrically connect) the sensing line SL and the second node N2, which is the source electrode of the first transistor ST1, to each other. The third transistor ST3 may be turned on based on the gate signal to supply an initialization voltage to the second node N2 and supply a sensing signal to the sensing line SL. A gate electrode of the third transistor ST3 may be connected to the gate line GL, the drain electrode of the third transistor ST3 may be connected to the second node N2, and a source electrode of the third transistor ST3 may be connected to the sensing line SL.

Figure 13:
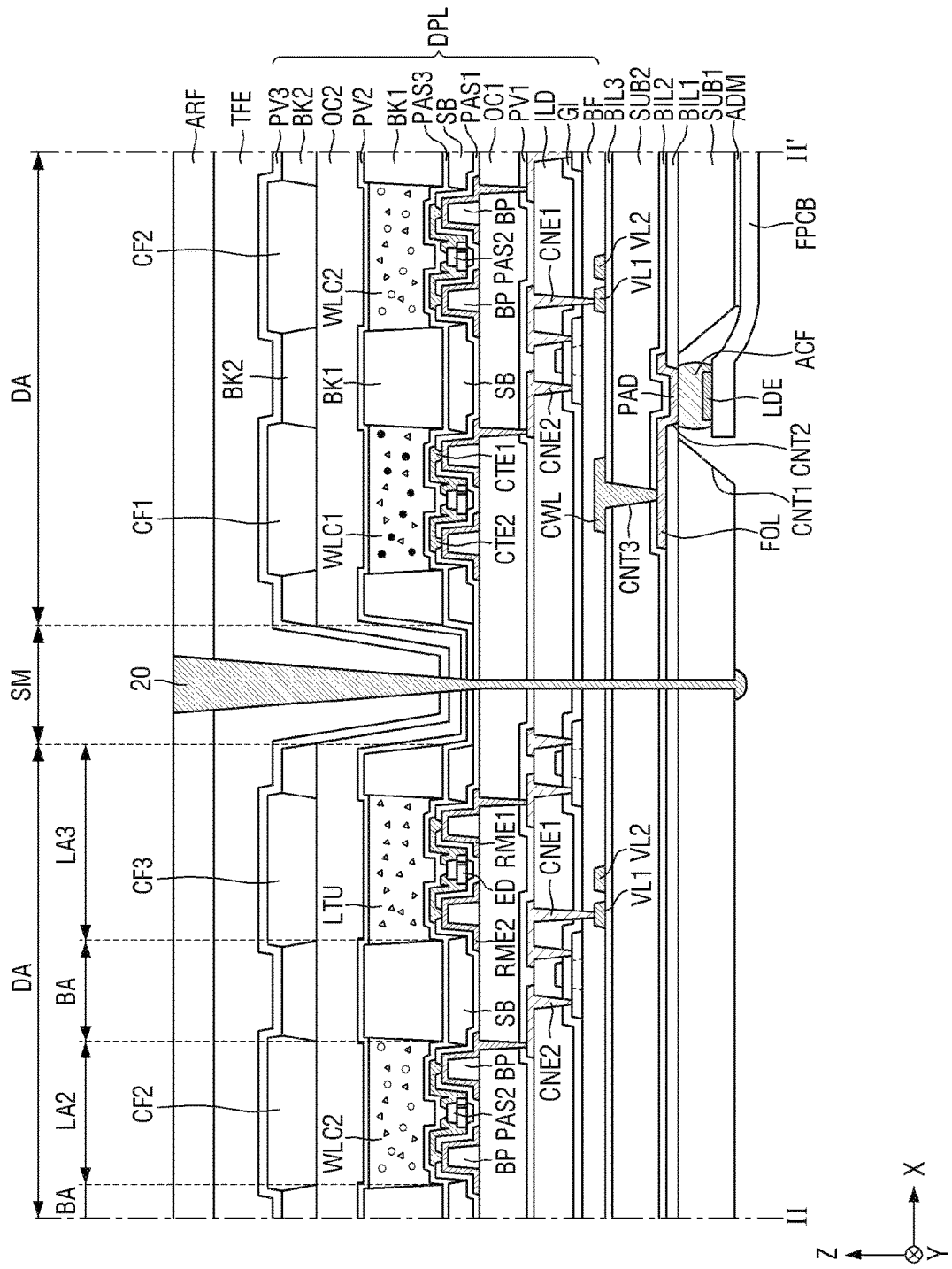
FIG. 13 is a schematic cross-sectional view taken along line II-IF of FIG. 1.

FIG. 13 is a schematic cross-sectional view taken along line II-IF of FIG. 1.

Referring to FIG. 13, the tiled display device TD may include display devices 10 and coupling members 20. The tiled display device TD may include first to fourth display devices 10-1 to 10-4. The number of display devices 10 and a coupling relationship between the display devices 10 are not limited to those of an embodiment of FIG. 1. The number of display devices 10 may be determined according to sizes of each of the display devices 10 and the tiled display device TD.

The display device 10 may include a display area DA and a non-display area NDA. The display area DA may include pixels SP to display an image. The non-display area NDA may be disposed around the display area DA to surround the display area DA, and may not display an image.

The tiled display device TD may include coupling areas SM disposed between display areas DA. The tiled display device TD may be formed by connecting the non-display areas NDA of adjacent display devices 10 to each other. The display devices 10 may be connected to each other through the coupling members 20 or adhesive members disposed in the coupling areas SM. The coupling areas SM of each of the display devices 10 may not include pad parts or fan-out lines connected to the pad parts. Accordingly, a distance between the display areas DA of each of the display devices 10 may be too small for the coupling areas SM to be recognized by the user. For example, external light reflectivity of the display areas DA of each of the display devices 10 may be substantially the same as external light reflectivity of the coupling areas SM. Accordingly, the tiled display device TD may remove a sense of discontinuity between the display devices 10 and improve a degree of immersion of an image by preventing the coupling areas SM between the display devices 10 from being recognized by the user.

In the tiled display device TD, side surfaces of adjacent display devices 10 may be coupled to each other by using the coupling members 20 disposed between the display devices 10. The coupling members 20 may connect side surfaces of the first to fourth display devices 10-1 to 10-4 arranged in a lattice shape to each other to implement the tiled display device TD. The coupling members 20 may couple side surfaces of the first substrates SUB1, side surfaces of the first and second barrier insulating layers BIL1 and BIL2, side surfaces of the second substrates SUB2, side surfaces of the third barrier insulating layers BIL3, side surfaces of the display layers DPL, side surfaces of the encapsulation layers TFE, and side surfaces of the anti-reflection films ARF of the adjacent display devices 10 to each other.

As an example, the coupling member 20 may be formed of an adhesive or a double-sided tape having a relatively small thickness to minimize an interval between the display devices 10. As another example, the coupling member 20 may be formed of a coupling frame having a relatively small thickness to minimize an interval between the display devices 10. Accordingly, the tiled display device TD may prevent the coupling areas SM between the display devices 10 from being recognized by the user.

FIGS. 14 to 21 are schematic cross-sectional views illustrating processes of manufacturing the display device according to an embodiment.

Figure 14:
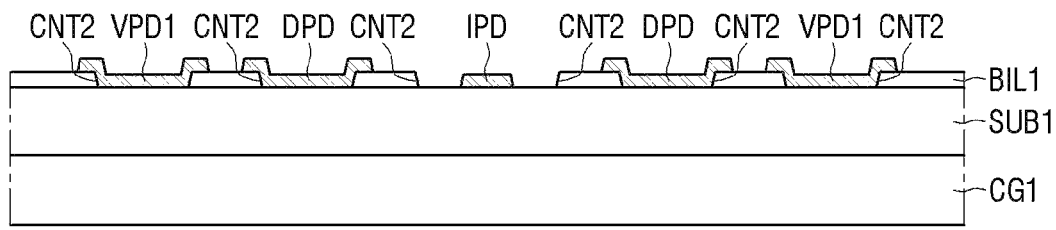
FIGS. 14 to 21 are schematic cross-sectional views illustrating processes of manufacturing the display device according to an embodiment.
Figure 14:
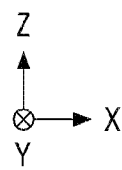

In FIG. 14, a first carrier substrate CG1 may support the display device 10 in the processes of manufacturing the display device 10. For example, the first carrier substrate CG1 may be a carrier glass, but embodiments are not limited thereto.

The first substrate SUB1 may be disposed on the first carrier substrate CG1. The first substrate SUB1 may be a base substrate or a base member. As an example, the first substrate SUB1 may include an insulating material such as a polymer resin, for example, polyimide (PI), but embodiments are not limited thereto.

The first barrier insulating layer BIL1 may be disposed on the first substrate SUB1. The first barrier insulating layer BIL1 may include an inorganic film capable of preventing penetration of air or moisture. The first barrier insulating layer BIL1 may include second contact holes CNT2. The second contact hole CNT2 may be etched from an upper surface of the first barrier insulating layer BIL1 to expose a portion of the upper surface of the first substrate SUB1. The second contact hole CNT2 may be formed through a dry etching process or a wet etching process, but embodiments are not limited thereto.

The pad part PAD and the inspection pad part IPD may be inserted into the second contact holes CNT2 of the first barrier insulating layer BIL1. The pad part PAD may include data pad parts DPD and first power pad parts VPD1. The data pad parts DPD may be integral with the first fan-out lines FOL1 and inserted into the second contact holes CNT2. A first width W1 of the data pad part DPD may be greater than a third width W3 of the second contact hole CNT2. The second contact hole CNT2 may surround the inspection pad part IPD so as to be spaced apart from the inspection pad part IPD. Accordingly, a second width W2 of the inspection pad part IPD may be smaller than the third width W3 of the second contact hole CNT2.

The pad part PAD and the inspection pad part IPD may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

Figure 15:
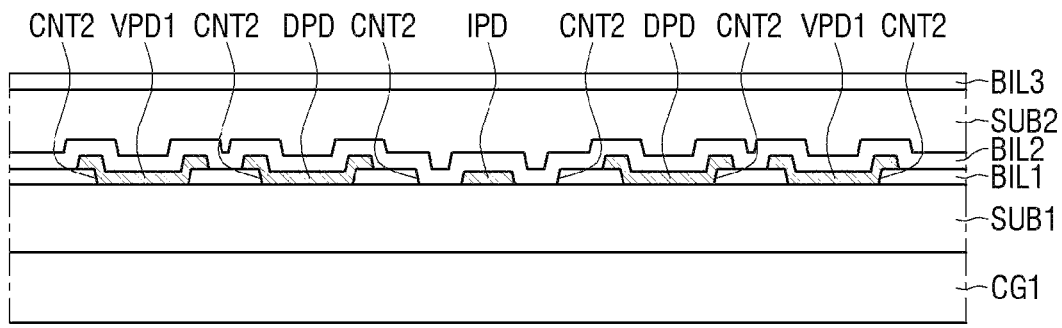
Figure 15:
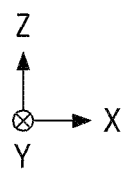

In FIG. 15, the second barrier insulating layer BIL2 may be disposed on the first barrier insulating layer BIL1 the pad part PAD, and the inspection pad part IPD. The second barrier insulating layer BIL2 may cover an area between the inspection pad part IPD and the first barrier insulating layer BIL1 spaced apart from each other. The second substrate SUB2 and the third barrier insulating layer BIL3 may be sequentially stacked on the second barrier insulating layer BIL2.

Figure 16:
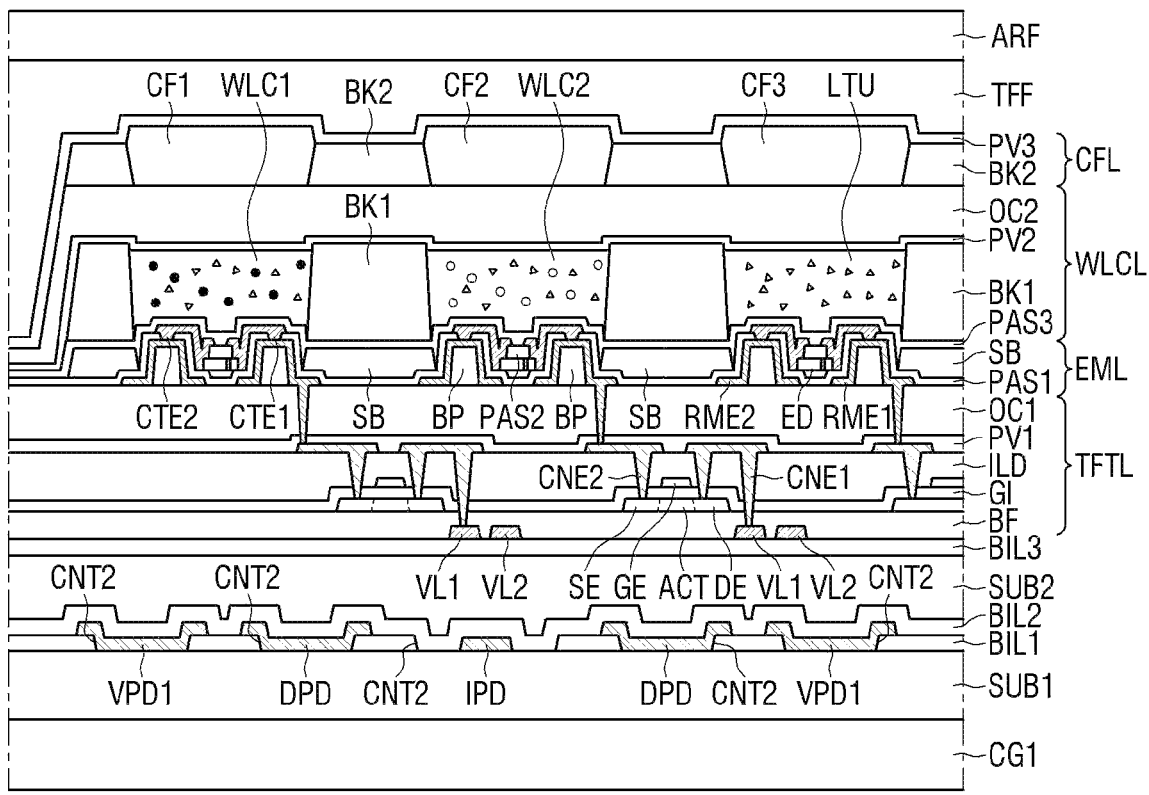

In FIG. 16, the display layer DPL may be stacked on the third barrier insulating layer BIL3. The thin film transistor layer TFTL, the light emitting element layer EML, the wavelength conversion layer WLCL, and the color filter layer CFL may be sequentially stacked on the third barrier insulating layer BIL3. The encapsulation layer TFE may cover an upper surface and side surfaces of the display layer DPL. The anti-reflection film ARF may be formed on the encapsulation layer TFE.

Figure 17:
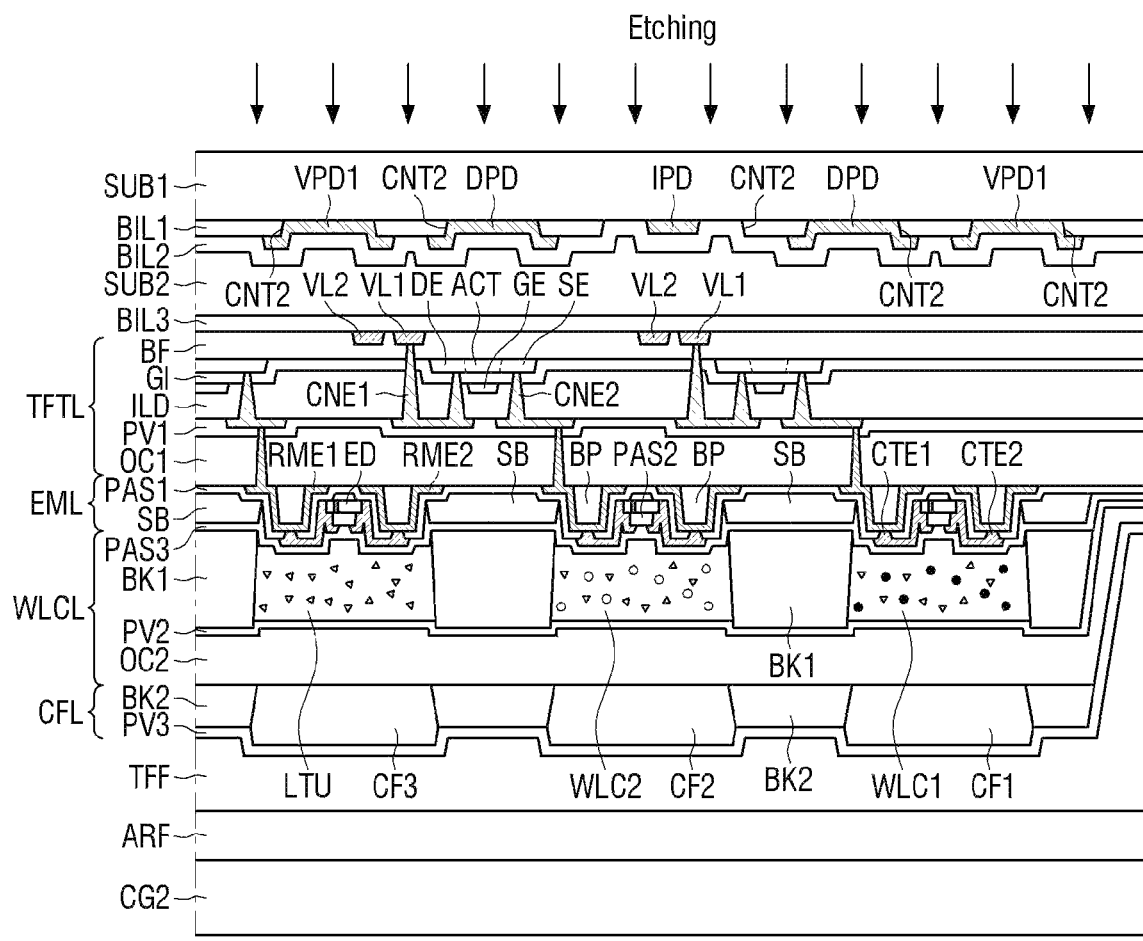
Figure 17:
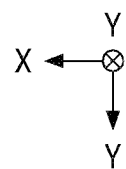
Figure 18:
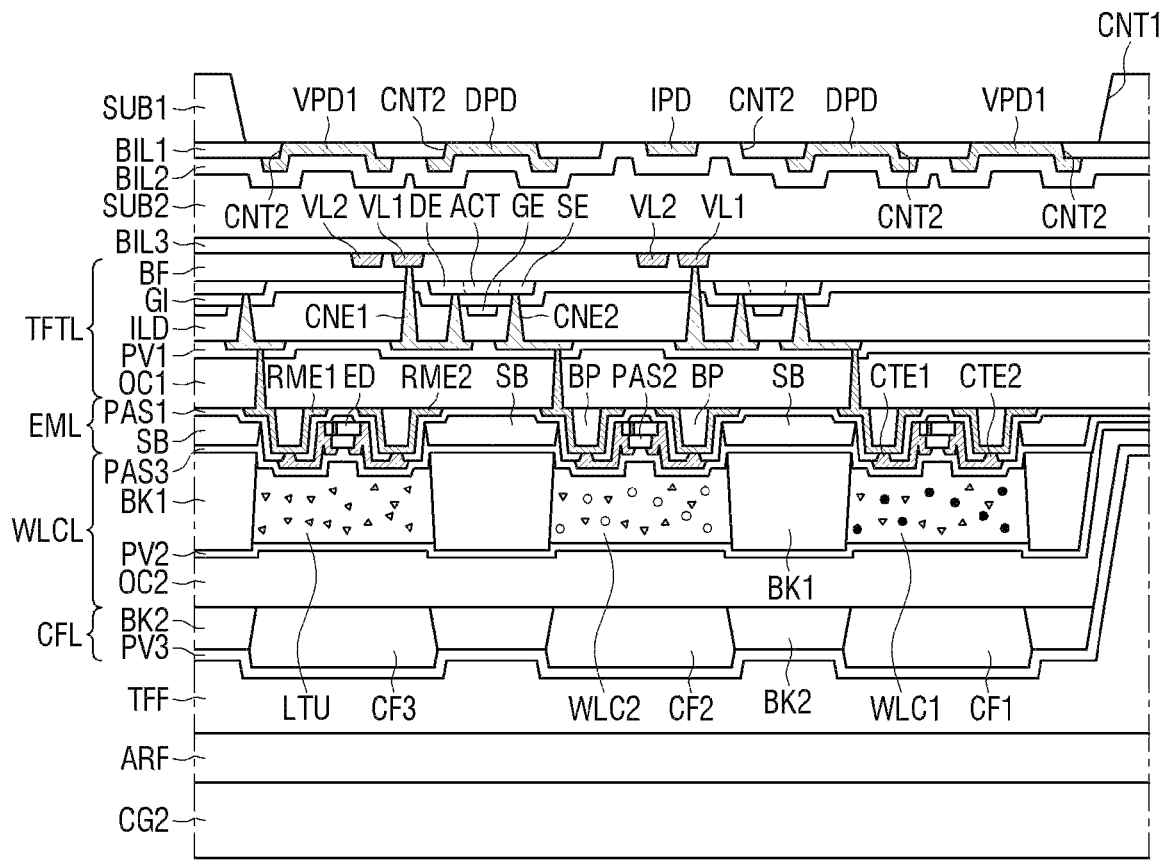
Figure 18:
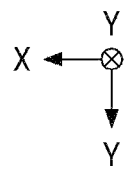

In FIGS. 17 and 18, the display device 10 that is being manufactured may be upside down in order to attach the flexible film FPCB. The first carrier substrate CG1 may be removed from the first substrate SUB1. For example, the first carrier substrate CG1 may be removed from a lower surface of the first substrate SUB1 by using a sacrificial layer disposed between the first carrier substrate CG1 and the first substrate SUB1, but embodiments are not limited thereto.

A second carrier substrate CG2 may be disposed on a surface of the anti-reflection film ARF. The second carrier substrate CG2 may support the display device 10 that is upside down. For example, the second carrier substrate CG2 may be a carrier glass, but embodiments are not limited thereto.

At least one of a dry etching process, a plasma etching process, and a laser etching process may be performed on a surface of the first substrate SUB. For example, a surface of the first substrate SUB1 may be patterned through an atmospheric pressure (AP) plasma process. Accordingly, the first contact hole CNT1 may be provided in the first substrate SUB1, and may expose the pad part PAD and the inspection pad part IPD.

Figure 19:
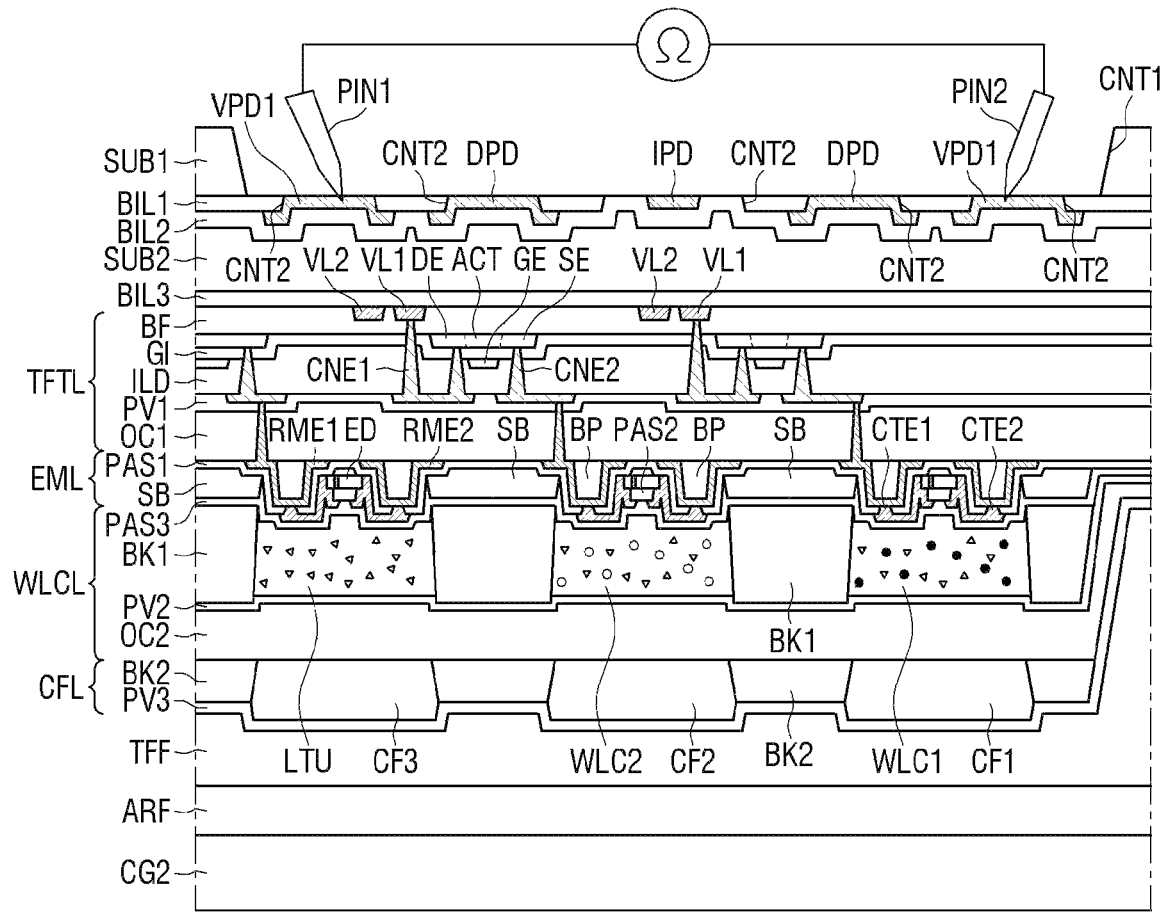

In FIG. 19, the inspection device may provide a first inspection pin PIN1 into contact with the first power pad part VPD1 disposed on (or adjacent to) a side of the first contact hole CNT1 and provide a second inspection pin PIN2 into contact with the first power pad part VPD1 disposed on (or adjacent to) another side of the first contact hole CNT1 to measure resistance $\Omega$ between the first power pad parts VPD1. In case that the inspection pad part IPD is not damaged in the process of forming the first contact hole CNT1, the resistance $\Omega$ between the first power pad parts VPD1 may have an appropriate resistance value (or a reference resistance value), and the inspection device may decide that the inspection pad part IPD is in a normal state. In case that the inspection pad part IPD is in the normal state, the inspection device may decide that the pad part PAD is also in a normal state as the pad part PAD and the inspection pad part IPD are formed of the same layer or disposed at the same level.

In case that the first substrate SUB1 is excessively etched in the process of forming the first contact hole CNT1, a portion of the data pad part DPD and the inspection pad part IPD inserted into the second contact holes CNT2 may be damaged. The first barrier insulating layer BIL1 may protect another portion of the data pad part DPD that is not inserted into the second contact hole CNT2 in the process of etching the first substrate SUB1. Accordingly, even though a portion of the data pad part DPD inserted into the second contact hole CNT2 is damaged, the data pad part DPD may have conductivity and may be connected (e.g., electrically connected) to the first fan-out line FOL1.

In case that it is damaged in the process of etching the first substrate SUB1, the inspection pad part IPD may not be protected by the first barrier insulating layer BIL1 and may thus lose conductivity. Accordingly, in case that the inspection pad part IPD is damaged, the inspection pad part IPD may be unable to connect (e.g., electrically connect) the first power pad parts VPD1 disposed on (or adjacent to) sides (e.g., opposite sides) of the first contact hole CNT1 to each other. In case that the inspection pad part IPD is damaged, the resistance $\Omega$ between the first power pad parts VPD1 may be excessively high, and the inspection device may decide that the inspection pad part IPD is damaged. In case that the inspection pad part IPD is damaged, the inspection device may decide that the pad part PAD is damaged as the pad part PAD and the inspection pad part IPD are formed of the same layer or disposed at the same level. The display device 10 may include the inspection pad part IPD having the width smaller than that of the second contact hole CNT2, and thus, may precisely decide that the inspection pad part IPD and the pad part PAD are damaged before the flexible film FPCB is attached. Accordingly, the display device 10 may save an inspection time, save a bonding material such as the flexible film FPCB, and increase a yield and a productivity by quickly deciding defective products that may not be confirmed with the naked eye.

Figure 20:
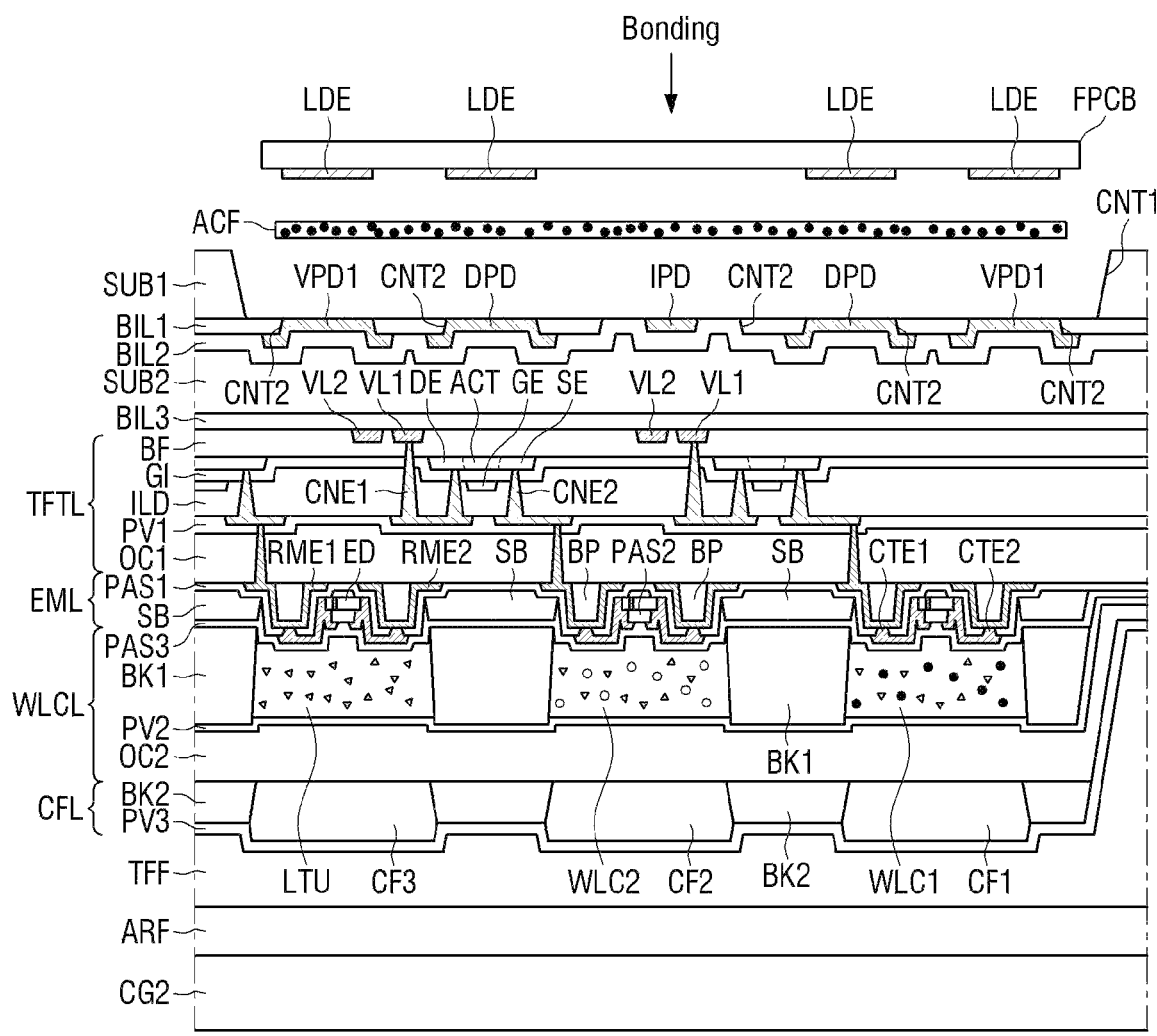
Figure 21:
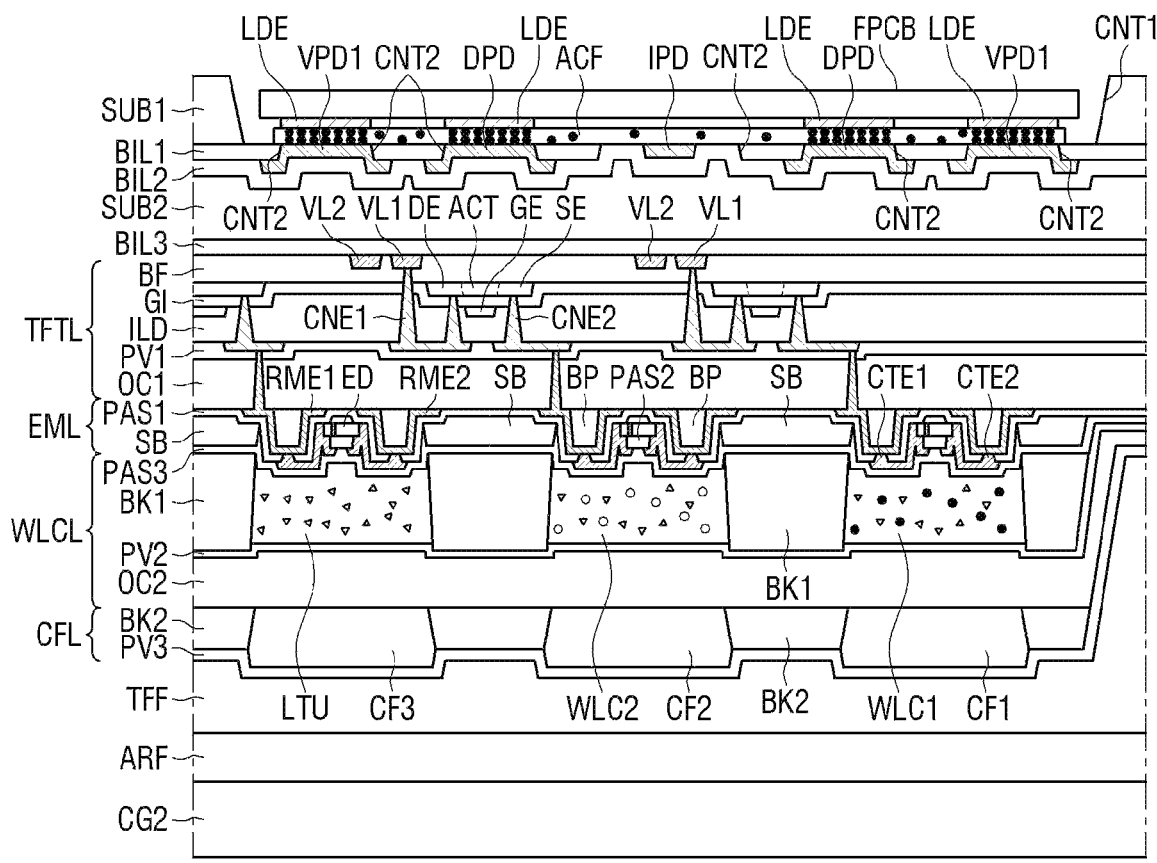
Figure 21:
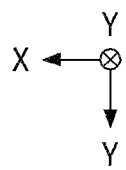

In FIGS. 20 and 21, in case that it is decided that the inspection pad part IPD and the pad part PAD are in the normal states, the flexible film FPCB may be disposed on a surface of the first substrate SUB1. The flexible film FPCB and the lead electrode LDE may be aligned on the pad part PAD through an alignment process. For example, the lead electrode LDE of the flexible film FPCB may be attached to the pad part PAD through ultrasonic bonding or thermocompression bonding, but a bonding method is not limited thereto. The connection film ACF may have conductivity in regions with which the pad part PAD and the lead electrode LDE are in contact, and may connect (e.g., electrically connect) the flexible film FPCB to the pad part PAD.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
    a first substrate including a first contact hole;
    a first barrier insulating layer disposed on the first substrate and including a plurality of second contact holes;
    pad parts inserted into some contact holes of the plurality of second contact holes;
    inspection pad parts inserted into other contact holes of the plurality of second contact holes;
    fan-out lines formed of a first metal layer on the first barrier insulating layer and being integral with the pad parts;
    a display layer disposed on the fan-out lines; and
    a flexible film disposed below the first substrate and inserted into the first contact hole to be electrically connected to the pad parts, wherein
    a width of each of the pad parts is greater than a width of each of the plurality of second contact holes, and
    a width of each of the inspection pad parts is smaller than the width of each of the second contact holes.

2. The display device of claim 1, further comprising a second barrier insulating layer disposed on the first barrier insulating layer, the pad parts, and the inspection pad parts,
    wherein the second barrier insulating layer covers an area between the inspection pad parts and the first barrier insulating layer spaced apart from each other.

3. The display device of claim 1, wherein the pad parts includes:
    a plurality of data pad parts that supply data voltages to the display layer; and
    a plurality of first power pad parts that supply high potential voltages to the display layer.

4. The display device of claim 3, wherein the inspection pad parts is disposed between the plurality of data pad parts.

5. The display device of claim 3, further comprising an inspection line electrically connecting the plurality of first power pad parts to the inspection pad parts.

6. The display device of claim 5, wherein the inspection line overlaps the first contact hole.

7. The display device of claim 3, wherein the display layer includes:
    connection parts formed of a second metal layer on the first metal layer and connected to the fan-out lines;
    a plurality of data lines formed of the second metal layer and extending in a first direction; and
    a plurality of high potential lines formed of the second metal layer and extending in the first direction.

8. The display device of claim 7, wherein
    the plurality of data pad parts are configured to supply the data voltages to the plurality of data lines through the connection parts, and
    the plurality of first power pad parts are configured to supply the high potential voltages to the plurality of high potential lines through the connection parts.

9. The display device of claim 1, wherein the pad parts includes:
    a plurality of data pad parts that supply data voltages to the display layer;
    a first power pad part that supplies a high potential voltage to the display layer; and
    a second power pad part that supplies a low potential voltage to the display layer.

10. The display device of claim 9, further comprising a plurality of inspection lines electrically connecting the first power pad part to the inspection pad parts and electrically connecting the second power pad part to the inspection pad parts.

11. The display device of claim 10, further comprising:
    a display area including a plurality of pixels; and
    a non-display area disposed around the display area,
    wherein each of the plurality of inspection lines extends from the first contact hole overlapping the display area to the non-display area.

12. The display device of claim 9, wherein the display layer includes:
    connection parts formed of a second metal layer on the first metal layer and connected to the fan-out lines;
    high potential lines formed of the second metal layer and extending in a first direction; and
    vertical voltage lines formed of the second metal layer and extending in the first direction.

13. The display device of claim 12, wherein
    the first power pad part is configured to supply the high potential voltage to the high potential lines through the connection parts, and
    the second power pad part is configured to supply the low potential voltage to the vertical voltage lines through the connection parts.

14. A method of manufacturing a display device comprising:
    providing a first substrate;
    providing a first barrier insulating layer disposed on the first substrate and including a plurality of second contact holes;
    forming inspection pad parts and pad parts, the inspection pad parts being inserted into some contact holes of the plurality of second contact holes, and the pad parts being disposed on the first barrier insulating layer and inserted into other contact holes of the plurality of second contact holes;

forming a display layer on the inspection pad parts and the pad parts;

forming a first contact hole passing through the first substrate from a lower portion of the first substrate;

inspecting states of the inspection pad parts and the pad parts; and forming a flexible film disposed below the first substrate and inserted into the first contact hole to be electrically connected to the pad parts, wherein a width of each of the inspection pad parts is smaller than a width of each of the plurality of second contact holes, and a width of each of the pad parts is greater than the width of each of the plurality of second contact holes.

15. The method of manufacturing a display device of claim 14, wherein the pad parts includes:
   a plurality of data pad parts that supply data voltages to the display layer; and
   a plurality of first power pad parts that supply high potential voltages to the display layer.

16. The method of manufacturing a display device of claim 15, wherein the inspecting of the states of the inspection pad parts and the pad parts includes deciding whether or not the inspection pad parts connected between the plurality of first power pad parts has a reference resistance value.

17. The method of manufacturing a display device of claim 14, wherein the pad parts includes:
   a plurality of data pad parts that supply data voltages to the display layer;
   a first power pad part that supplies a high potential voltage to the display layer; and
   a second power pad part that supplies a low potential voltage to the display layer.

18. The method of manufacturing a display device of claim 17, wherein the inspecting of the states of the inspection pad parts and the pad parts includes deciding whether or not the inspection pad parts connected between the first and second power pad parts has a reference resistance value.

19. The method of manufacturing a display device of claim 17, wherein the forming of the inspection pad parts and the pad parts includes forming an inspection line electrically connecting each of the first and second power pad parts to the inspection pad parts, and
   the inspecting of the states of the inspection pad parts and the pad parts further includes removing a portion of the inspection line in case that it is decided that the inspection pad parts and the pad parts are in normal states.

20. A tiled display device comprising:
a plurality of display devices each including a display area including a plurality of pixels and a non-display area surrounding the display area; and
a coupling member coupling the plurality of display devices to each other, wherein
each of the plurality of display devices includes:
   a first substrate including a first contact hole;
   a first barrier insulating layer disposed on the first substrate and including a plurality of second contact holes;
   pad parts inserted into some contact holes of the plurality of second contact holes;
   inspection pad parts inserted into other contact holes of the plurality of second contact holes;
   fan-out lines formed of a first metal layer on the first barrier insulating layer and being integral with the pad parts;
   a display layer disposed on the fan-out lines; and
   a flexible film disposed below the first substrate and inserted into the first contact hole to be electrically connected to the pad parts, and
a width of each of the pad parts is greater than a width of each of the plurality of second contact holes, and a width of the inspection pad parts is smaller than the width of each of the plurality of second contact holes.

* * * * *